United States Patent
Kobayashi et al.

(10) Patent No.: US 11,366,390 B2
(45) Date of Patent: Jun. 21, 2022

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Takanari Kobayashi, Oyama (JP); Hirokazu Hosoda, Oyama (JP); Yoshiyuki Honda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/337,560

(22) Filed: Jun. 3, 2021

(65) Prior Publication Data

US 2022/0035249 A1    Feb. 3, 2022

(30) Foreign Application Priority Data

Jul. 30, 2020   (JP) .............................. JP2020-129666

(51) Int. Cl.
*G03F 7/20* (2006.01)
*H05G 2/00* (2006.01)
*H01L 21/027* (2006.01)

(52) U.S. Cl.
CPC ........ *G03F 7/2006* (2013.01); *G03F 7/70025* (2013.01); *H05G 2/008* (2013.01); *H01L 21/0275* (2013.01)

(58) Field of Classification Search
None
See application file for complete search history.

(56) References Cited

U.S. PATENT DOCUMENTS

| | | |
|---|---|---|
| 2015/0189729 A1 | 7/2015 | Rafac et al. |
| 2016/0007434 A1 | 1/2016 | Tao et al. |
| 2016/0073487 A1* | 3/2016 | Yanagida ............... H05G 2/006 250/504 R |

* cited by examiner

*Primary Examiner* — Michelle M Iacoletti
(74) *Attorney, Agent, or Firm* — Studebaker & Brackett PC

(57) ABSTRACT

An extreme ultraviolet light generation system may include a laser system emitting first prepulse laser light, second prepulse laser light, and main pulse laser light in this order; a chamber including at least one window for introducing, into the chamber, the first prepulse laser light, the second prepulse laser light, and the main pulse laser light; a target supply unit supplying a target to a predetermined region in the chamber; and a processor controlling the laser system to irradiate the target with the first prepulse laser light, irradiate the target, having been irradiated with the first prepulse laser light, with the second prepulse laser light having a pulse time width longer than a pulse time width of the main pulse laser light, and irradiate the target, having been irradiated with the second prepulse laser light, with the main pulse laser light temporally separated from the second prepulse laser light.

20 Claims, 17 Drawing Sheets

TERTIARY TARGET IN COMPARATIVE EXAMPLE

TERTIARY TARGET IN FIRST EMBODIMENT

EXTREME ULTRAVIOLET LIGHT GENERATION SYSTEM AND ELECTRONIC DEVICE MANUFACTURING METHOD

CROSS-REFERENCE TO RELATED APPLICATIONS

The present application claims the benefit of Japanese Patent Application No. 2020-129666, filed on Jul. 30, 2020, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents
  Patent Document 1: US Patent Application Publication No. 2016/0007434
  Patent Document 2: US Patent Application Publication No. 2015/0189729
  Patent Document 3: US Patent Application Publication No. 2016/0073487

SUMMARY

An extreme ultraviolet light generation system according to an aspect of the present disclosure includes a laser system configured to emit first prepulse laser light, second prepulse laser light, and main pulse laser light in this order; a chamber including at least one window for introducing, into the chamber, the first prepulse laser light, the second prepulse laser light, and the main pulse laser light; a target supply unit configured to supply a target to a predetermined region in the chamber; and a processor configured to control the laser system so as to irradiate the target with the first prepulse laser light, irradiate the target, having been irradiated with the first prepulse laser light, with the second prepulse laser light having a pulse time width longer than a pulse time width of the main pulse laser light, and irradiate the target, having been irradiated with the second prepulse laser light, with the main pulse laser light temporally separated from the second prepulse laser light.

An electronic device manufacturing method according to an aspect of the present disclosure includes generating extreme ultraviolet light using an extreme ultraviolet light generation system; emitting the extreme ultraviolet light to an exposure apparatus; and exposing a photosensitive substrate to the extreme ultraviolet light in the exposure apparatus to manufacture an electronic device. Here, the extreme ultraviolet light generation system includes a laser system configured to emit first prepulse laser light, second prepulse laser light, and main pulse laser light in this order; a chamber including at least one window for introducing, into the chamber, the first prepulse laser light, the second prepulse laser light, and the main pulse laser light; a target supply unit configured to supply a target to a predetermined region in the chamber; and a processor configured to control the laser system so as to irradiate the target with the first prepulse laser light, irradiate the target, having been irradiated with the first prepulse laser light, with the second prepulse laser light having a pulse time width longer than a pulse time width of the main pulse laser light, and irradiate the target, having been irradiated with the second prepulse laser light, with the main pulse laser light temporally separated from the second prepulse laser light.

BRIEF DESCRIPTION OF THE DRAWINGS

Embodiments of the present disclosure will be described below merely as examples with reference to the accompanying drawings.

DESCRIPTION OF EMBODIMENTS

Figure 1:
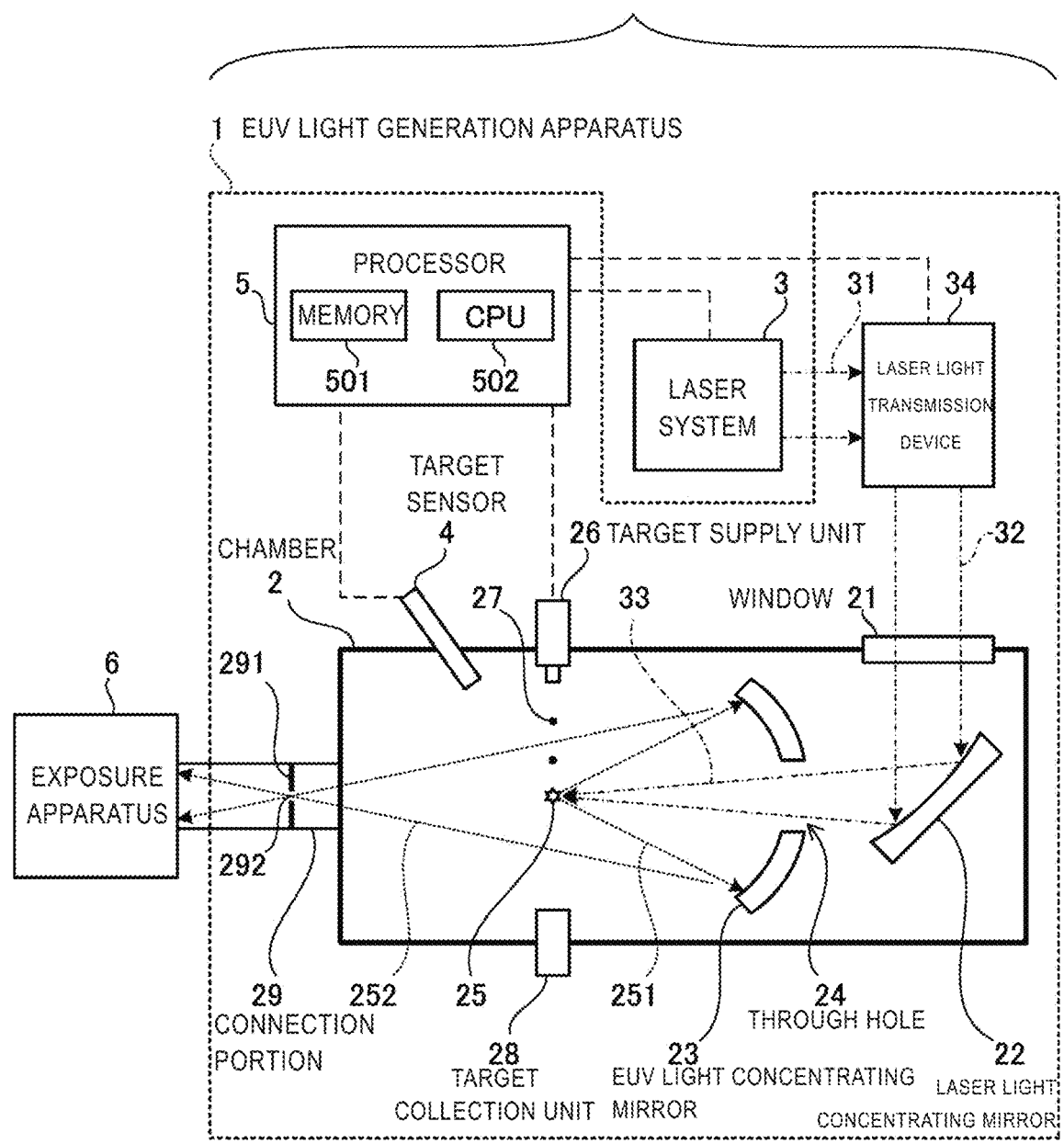
FIG. 1 schematically shows an exemplary configuration of an LPP EUV light generation system.

<Contents>
1. Overall description of EUV light generation system 11
   1.1 Configuration
   1.2 Operation
2. EUV light generation system 11 according to comparative example
   2.1 Configuration
   2.2 Operation
   2.2.1 Output of target 27
   2.2.2 Emission of pulse laser light
   2.2.3 Transmission of pulse laser light
   2.2.4 Concentration of pulse laser light
   2.2.5 Pulse time width and irradiation timing
   2.3 Problem
3. EUV light generation system 11 with second prepulse laser light SP having longer pulse time width Hsp
   3.1 Configuration
   3.2 Operation
   3.2.1 Operation of optical pulse stretcher 35
   3.2.2 Pulse time width and irradiation timing
   3.3 CE improvement
   3.4 Other configuration examples
   3.5 Range of pulse time width Hsp of second prepulse laser light SP
   3.6 Range of fluence of second prepulse laser light SP
   3.7 Range of fluence of first prepulse laser light FP less than 1 ns
   3.8 Range of fluence of first prepulse laser light FP of 1 ns or more
   3.9 Range of dimension D12 of secondary target 272
   3.10 Effect
4. $CO_2$ laser device for emitting second prepulse laser light SP
   4.1 Configuration
   4.2 Operation
   4.3 Details of first master oscillator MO1
   4.3.1 First configuration example
   4.3.2 Second configuration example
   4.4 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically shows an exemplary configuration of an LPP EUV light generation system 11. An EUV light generation apparatus 1 is used together with a laser system 3. In the present disclosure, a system including the EUV light generation apparatus 1 and the laser system 3 is referred to as an EUV light generation system 11. The EUV light generation apparatus 1 includes a chamber 2 and a target supply unit 26. The chamber 2 is a sealable container. The target supply unit 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulse laser light 32 emitted from the laser system 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged so that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between an internal space of the chamber 2 and an internal space of an exposure apparatus 6. A wall 291 in which an aperture is formed is arranged in the connection portion 29. The wall 291 is arranged so that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 emitted from the laser system 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 supplies the target 27 containing the target substance to the plasma generation region 25 in the chamber 2. The target 27 is irradiated with the pulse laser light 33. The target 27 irradiated with the pulse laser light 33 is turned into plasma, and radiation light 251 is radiated from the plasma. The EUV light contained in the radiation light 251 is reflected by the EUV light concentrating mirror 23 at higher reflectance than light in other wavelength ranges. Reflection light 252 including the EUV light reflected by the EUV light concentrating mirror 23 is concentrated at the intermediate focal point 292 and output to the exposure apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls the timing at which the target 27 is output, an output direction of the target 27, and the like. Furthermore, the processor 5 controls the oscillation timing of the laser system 3, the travel direction of the pulse laser light 32, the concentrating position of the pulse laser light 33, and the like. Such various kinds of control described above are merely exemplary, and other control may be added as necessary.

2. EUV Light Generation System 11 According to Comparative Example

2.1 Configuration

Figure 2:
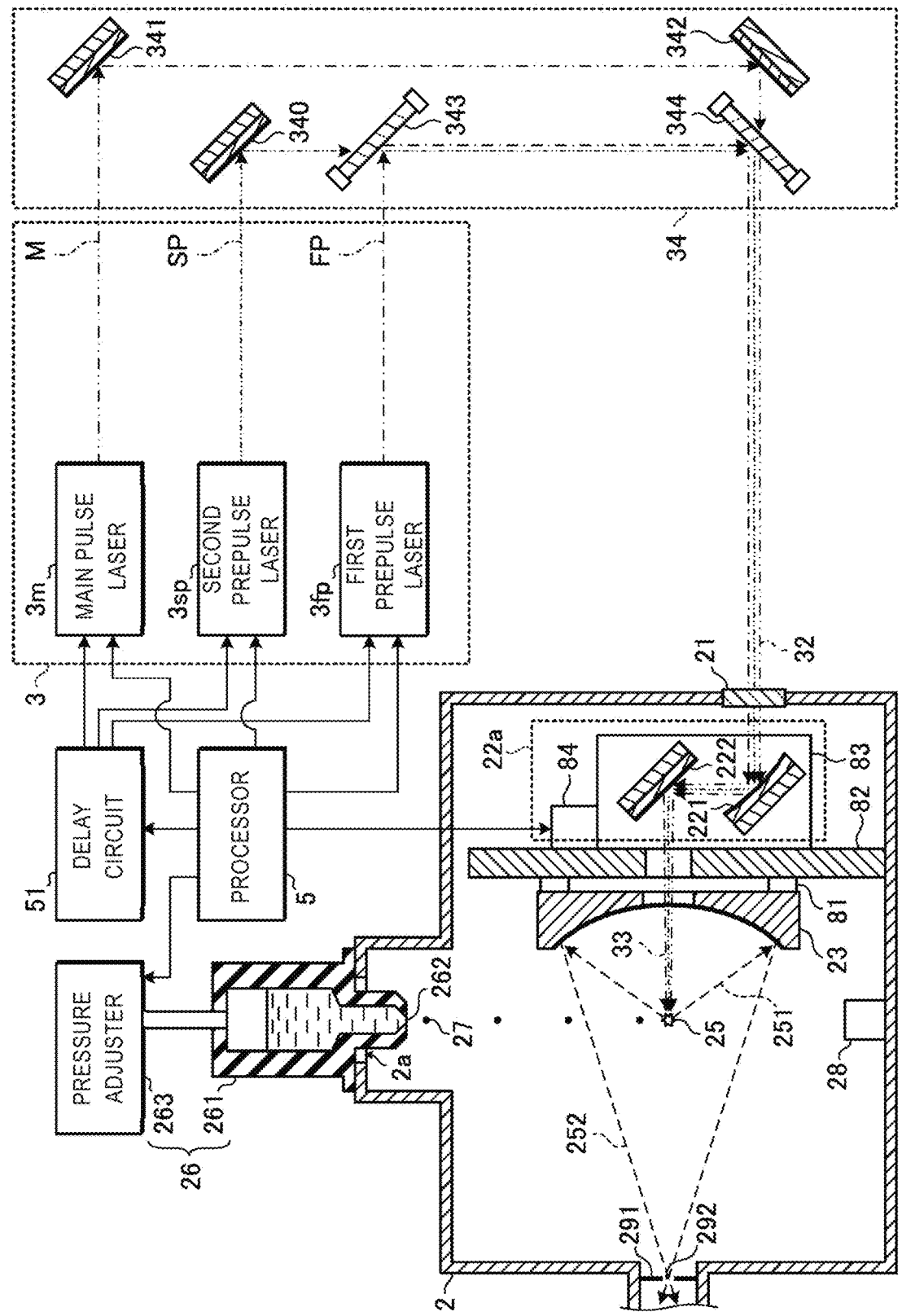
FIG. 2 is a partial sectional view showing a configuration of an EUV light generation system according to a comparative example.

FIG. 2 is a partial sectional view showing a configuration of the EUV light generation system 11 according to a comparative example. As shown in FIG. 2, a laser light concentrating optical system 22a, the EUV light concentrating mirror 23, the target collection unit 28, an EUV light concentrating mirror holder 81, plates 82 and 83, and a position adjustment mechanism 84 are provided in the chamber 2. The target supply unit 26 is attached to the chamber 2. Here, the target sensor 4 (see FIG. 1) is not shown. The laser system 3, the laser light transmission device 34, and the processor 5 are provided outside the chamber 2.

The target supply unit 26 includes a reservoir 261 and a pressure adjuster 263. The reservoir 261 stores the melted target substance therein. A part of the reservoir 261 penetrates a through hole 2a formed on a wall surface of the chamber 2. An opening 262 at the distal end of the reservoir 261 is located in the chamber 2.

The laser system 3 includes a first prepulse laser 3fp, a second prepulse laser 3sp, and a main pulse laser 3m. Each of the first prepulse laser 3fp and the second prepulse laser 3sp includes, for example, a YAG laser device. The main pulse laser 3m includes, for example, a $CO_2$ laser device.

First prepulse laser light FP emitted by the first prepulse laser 3fp includes a first wavelength component and is linearly polarized light having a polarization direction perpendicular to the paper surface. The first wavelength component is, for example, a wavelength component of about 1.06 μm. Second prepulse laser light SP emitted by the second prepulse laser 3sp includes the first wavelength component and is linearly polarized light having a polarization direction parallel to the paper surface. Main pulse laser light M emitted by the main pulse laser 3m includes a second wavelength component. The second wavelength component is, for example, a wavelength component of about 10.6 μm.

The laser light transmission device 34 includes high reflection mirrors 340, 341, and 342, and beam combiners 343 and 344. The beam combiner 343 includes a polarization beam splitter that reflects linearly polarized light having a polarization direction perpendicular to the paper surface at high reflectance and transmits linearly polarized light having a polarization direction parallel to the paper surface at high transmittance. The beam combiner 344 includes a dichroic mirror that reflects light including the first wavelength component at high reflectance and transmits light including the second wavelength component at high transmittance.

The plate 82 is fixed to the chamber 2. The plate 83 is supported by the plate 82. The laser light concentrating optical system 22a includes an off-axis parabolic mirror 221 and a planar mirror 222. The position adjustment mechanism 84 is capable of adjusting the position of the plate 83 with respect to the plate 82. By adjusting the position of the plate 83, the positions of the off-axis parabolic mirror 221 and the planar mirror 222 are adjusted. The positions of the off-axis parabolic mirror 221 and the planar mirror 222 are adjusted so that the pulse laser light 33 reflected by these mirrors is focused on the plasma generation region 25.

The EUV light concentrating mirror 23 is fixed to the plate 82 via the EUV light concentrating mirror holder 81.

2.2 Operation

2.2.1 Output of Target 27

The pressure adjuster 263 included in the target supply unit 26 adjusts the pressure of the inert gas supplied from an inert gas cylinder (not shown) to the reservoir 261 in accordance with a control signal output from the processor 5. The inert gas pressurizes the target substance in the reservoir 261, thereby outputting a jet of the liquid target substance through the opening 262.

When vibration is applied to the reservoir 261 by a vibrating element (not shown) provided in the vicinity of the tip end of the reservoir 261, the jet of the target substance is separated into a plurality of targets 27 in the form of droplets. The plurality of targets 27 move toward the plasma generation region 25 in the output order. The target collection unit 28 collects the targets 27 that have passed through the plasma generation region 25.

2.2.2 Emission of Pulse Laser Light

The processor 5 controls the laser system 3 as follows. The processor 5 outputs signals for setting the pulse time width and the pulse energy to the first prepulse laser 3fp, the second prepulse laser 3sp, and the main pulse laser 3m. The processor 5 outputs signals for setting first to third trigger delay times to a delay circuit 51. Further, the processor 5 outputs a target detection signal output from the target sensor 4 (see FIG. 1) to the delay circuit 51.

The delay circuit 51 outputs, to the first prepulse laser 3fp, a first trigger signal indicating that the first trigger delay time has elapsed with respect to the reception timing of the target detection signal. The first prepulse laser 3fp emits the first prepulse laser light FP in accordance with the first trigger signal.

The delay circuit 51 outputs, to the second prepulse laser 3sp, a second trigger signal indicating that the second trigger delay time longer than the first trigger delay time has elapsed with respect to the reception timing of the target detection signal. The second prepulse laser 3sp emits the second prepulse laser light SP in accordance with the second trigger signal.

The delay circuit 51 outputs, to the main pulse laser 3m, a third trigger signal indicating that the third trigger delay time longer than the second trigger delay time has elapsed with respect to the reception timing of the target detection signal. The main pulse laser 3m emits the main pulse laser light M in accordance with the third trigger signal.

Thus, the laser system 3 emits the first prepulse laser light FP, the second prepulse laser light SP, and the main pulse laser light M in this order. Pulse laser light other than the above such as third prepulse laser light may not be emitted.

2.2.3 Transmission of Pulse Laser Light

The high reflection mirror 340 included in the laser light transmission device 34 reflects the second prepulse laser light SP at high reflectance. The beam combiner 343 reflects the first prepulse laser light FP having a polarization direction perpendicular to the paper surface at high reflectance, and transmits the second prepulse laser light SP having a polarization direction parallel to the paper surface at high transmittance.

The high reflection mirrors 341 and 342 reflect the main pulse laser light M at high reflectance. The beam combiner 344 reflects the first prepulse laser light FP and the second prepulse laser light SP each having the first wavelength component at high reflectance, and transmits the main pulse laser light M having the second wavelength component at high transmittance. The first prepulse laser light FP, the second prepulse laser light SP, and the main pulse laser light M are incident on the window 21 as the pulse laser light 32, and introduced into the chamber 2.

2.2.4 Concentration of Pulse Laser Light

The pulse laser light 32 is reflected toward the planar mirror 222 by the off-axis parabolic mirror 221 included in the laser light concentrating optical system 22a. The planar mirror 222 reflects the pulse laser light 32 as the pulse laser light 33. The pulse laser light 33 includes the first prepulse laser light FP, the second prepulse laser light SP, and the main pulse laser light M. The pulse laser light 33 is concentrated in the plasma generation region 25 or the vicinity thereof in accordance with the shape of the reflection surface of the off-axis parabolic mirror 221.

2.2.5 Pulse Time Width and Irradiation Timing

Figure 3:
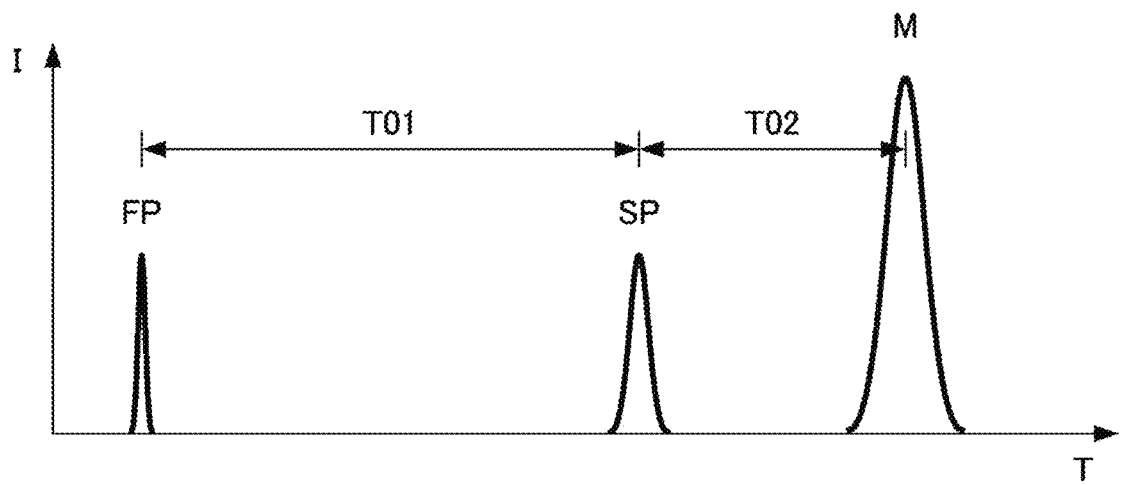
FIG. 3 conceptually shows pulse time waveforms of first prepulse laser light, second prepulse laser light, and main pulse laser light in the comparative example.

FIG. 3 conceptually shows pulse time waveforms of the first prepulse laser light FP, the second prepulse laser light SP, and the main pulse laser light M in the comparative example. In FIG. 3, the horizontal axis represents time T and the vertical axis represents light intensity I.

In the plasma generation region 25 or the vicinity thereof, one target 27 is irradiated with the first prepulse laser light FP, the second prepulse laser light SP, and the main pulse laser light M in this order. The pulse time widths by the full width at half maximum of the first prepulse laser light FP, the second prepulse laser light SP, and the main pulse laser light M are, for example, 14 ps, 6 ns, and 15 ns, respectively.

Figure 4:
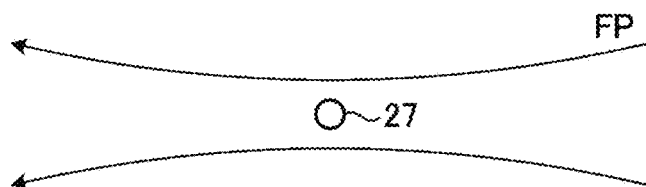
FIG. 4 conceptually shows a state in which a target is irradiated with the first prepulse laser light in the comparative example.

FIG. 4 conceptually shows a state in which the target 27 is irradiated with the first prepulse laser light FP in the comparative example. The laser light transmission device 34 and the laser light concentrating optical system 22a are adjusted so that the position of the beam waist of the first prepulse laser light FP substantially coincides with the position of the target 27. When the target 27 is irradiated with the first prepulse laser light FP, the target 27 in the form of droplet is broken into a plurality of fine particles, which are diffused to generate a secondary target 272 (see FIG. 5).

Figure 5:
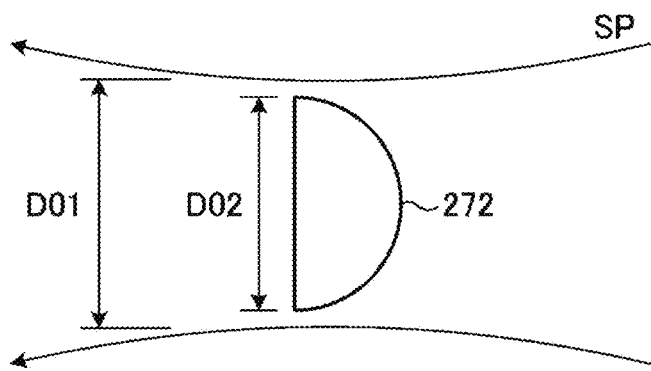
FIG. 5 conceptually shows a state in which a secondary target is irradiated with the second prepulse laser light in the comparative example.

FIG. 5 conceptually shows a state in which the secondary target 272 is irradiated with the second prepulse laser light SP in the comparative example. The laser light transmission device 34 and the laser light concentrating optical system 22a are adjusted so that the position of the beam waist of the second prepulse laser light SP substantially coincides with the position of the secondary target 272. By irradiating the secondary target 272 with the second prepulse laser light SP, the plurality of fine particles constituting the secondary target 272 are further atomized, and a tertiary target including at least the vapor of the target substance is generated. The tertiary target will be described later with reference to FIG. 12.

The laser light transmission device 34 and the laser light concentrating optical system 22a are adjusted so that the position of the beam waist of the main pulse laser light M substantially coincides with the position of the tertiary target. By irradiating the tertiary target with the main pulse laser light M, the target substance is efficiently turned into plasma, and EUV light is generated.

Referring again to FIG. 3, a delay time from the irradiation timing of the target 27 with the first prepulse laser light FP to the irradiation timing of the secondary target 272 with the second prepulse laser light SP is defined as a first delay time T01. The first delay time T01 is controlled with the first and second trigger delay times set in the delay circuit 51.

The first delay time T01 is set so that conversion efficiency (CE) from the pulse energy of the main pulse laser light M to the pulse energy of the EUV light becomes the highest. The first delay time T01 is, for example, 1.4 µs. The dimension D02 of the secondary target 272 at the irradiation timing with the second prepulse laser light SP (see FIG. 5) is slightly smaller than the dimension D01 of the beam cross section of the second prepulse laser light SP at the position of the secondary target 272. In the present disclosure, the dimension of the secondary target 272 refers to the maximum diameter of the secondary target 272. For example, if the secondary target 272 has a shape of half a sphere, the dimension of the secondary target 272 corresponds to the diameter of the sphere. When the position of the beam waist of the second prepulse laser light SP substantially coincides with the position of the secondary target 272, the dimension D01 of the beam cross section of the second prepulse laser light SP at the position of the secondary target 272 substantially coincides with the spot size of the second prepulse laser light SP.

A delay time from the irradiation timing of the secondary target 272 with the second prepulse laser light SP to the irradiation timing of the tertiary target with the main pulse laser light M is defined as a second delay time T02. The second delay time T02 is controlled with the second and third trigger delay times set in the delay circuit 51.

The second delay time T02 is also set so that CE becomes the highest. The second delay time T02 is, for example, 0.1 µs.

2.3 Problem

The EUV light generation system 11 is required to further increase power of the EUV light. Therefore, it is important to further improve CE.

In the embodiments described below, CE is improved by increasing the pulse time width of the second prepulse laser light SP.

Figure 6:
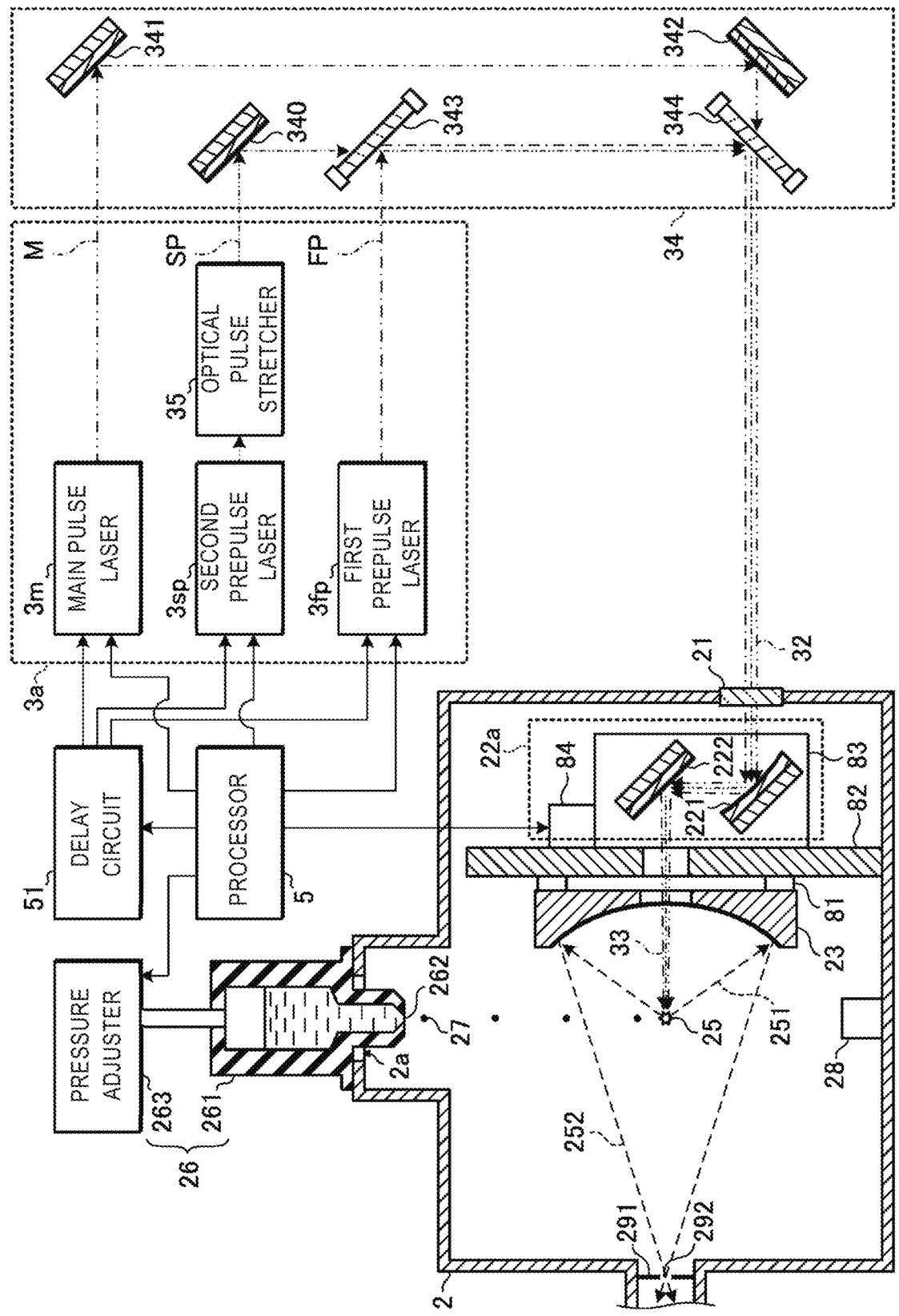
FIG. 6 is a partial sectional view showing the configuration of the EUV light generation system according to a first embodiment.

3. EUV Light Generation System 11 with Second Prepulse Laser Light SP Having Longer Pulse Time Width Hsp 3.1 Configuration FIG. 6 is a partial sectional view showing the configuration of the EUV light generation system 11 according to a first embodiment. In the first embodiment, a laser system 3a includes an optical pulse stretcher 35 arranged in the optical path of the second prepulse laser light SP between the second prepulse laser 3sp and the beam combiner 343.

Figure 7:
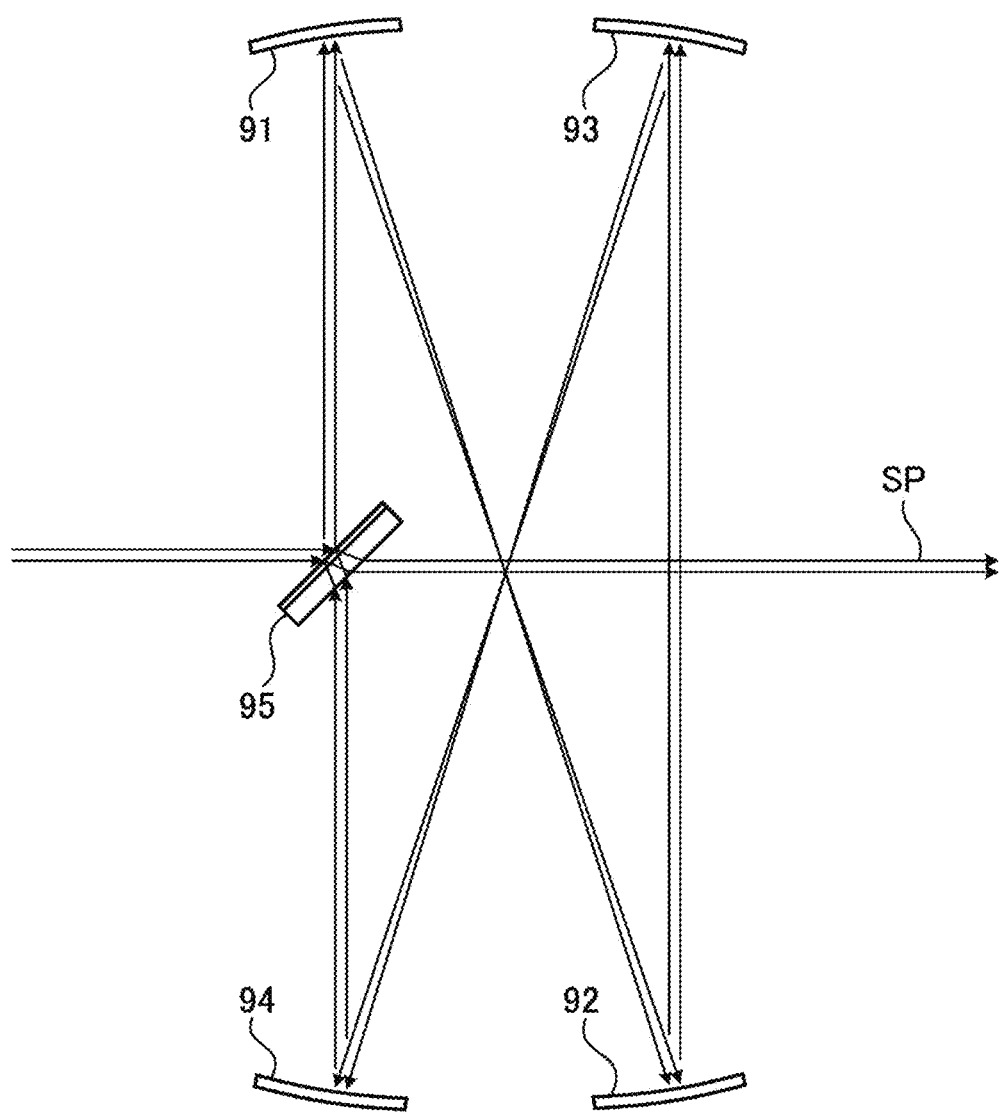
FIG. 7 shows a configuration of an optical pulse stretcher of the first embodiment.

FIG. 7 shows a configuration of the optical pulse stretcher 35 in the first embodiment. The optical pulse stretcher 35 includes a beam splitter 95 and first to fourth concave mirrors 91 to 94. The beam splitter 95 is configured to reflect about 60% of the second prepulse laser light SP incident at an incident angle of 45° and transmit most of the remaining, that is about 40%, thereof. Each of the first to fourth concave mirrors 91 to 94 is a spherical mirror.

3.2 Operation
3.2.1 Operation of Optical Pulse Stretcher 35

The second prepulse laser light SP emitted by the second prepulse laser 3sp to the optical pulse stretcher 35 is incident on the beam splitter 95 rightward in FIG. 7. The beam splitter 95 transmits rightward a part of the second prepulse laser light SP incident rightward thereon and outputs it as a first beam, and reflects another part thereof upward in FIG. 7.

The light reflected upward is sequentially reflected by the first to fourth concave mirrors 91 to 94 and incident upward on the beam splitter 95. The beam cross section of the second prepulse laser light SP incident from the second prepulse laser asp on the beam splitter 95 is imaged on the beam splitter 95 with a size of 1:1 owing to the first to fourth concave mirrors 91 to 94. The beam splitter 95 reflects rightward in FIG. 7 a part of the light incident upward thereon from the fourth concave mirror 94 and outputs it as a second beam.

The first beam transmitted rightward in FIG. 7 through the beam splitter 95 and the second beam reflected rightward by the beam splitter 95 are substantially coaxial with each other, and have a time difference corresponding to the optical path length of the delay optical path formed by the first to fourth concave mirrors 91 to 94. By spatially overlapping the first beam and the second beam, it is possible to output the second prepulse laser light SP having an extended pulse time width.

The beam splitter 95 transmits upward another part of the light incident thereon upward in FIG. 7 from the fourth concave mirror 94. Thereafter, a part of the light having passed through the delay optical path again may be output from the beam splitter 95 as a third beam, and a part of the light having passed through the delay optical path yet again may be output from the beam splitter 95 as a fourth beam. The third beam is more attenuated than the second beam, and the fourth beam is more attenuated than the third beam. The third beam and the fourth beam are spatially overlapped with the first beam and the second beam. By adding the third beam and the fourth beam, the second prepulse laser light SP having a further extended pulse time width is output.

3.2.2 Pulse Time Width and Irradiation Timing

Figure 8:
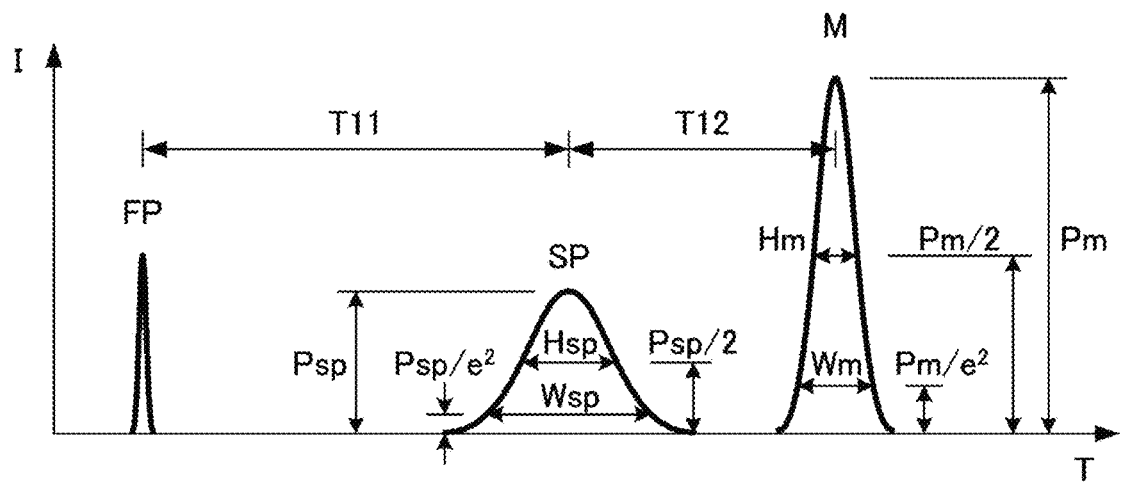
FIG. 8 conceptually shows pulse time waveforms of the first prepulse laser light, the second prepulse laser light, and the main pulse laser light in the first embodiment.

FIG. 8 conceptually shows pulse time waveforms of the first prepulse laser light FP, the second prepulse laser light SP, and the main pulse laser light M in the first embodiment. The pulse time waveforms shown in FIG. 8 are different from the pulse time waveforms shown in FIG. 3 in that the pulse time width Hsp by the full width at half maximum of the second prepulse laser light SP is longer than the pulse time width Hm by the full width at half maximum of the main pulse laser light M. The pulse time width Hsp of the second prepulse laser light SP is, for example, 40 ns.

In the following description, the pulse time width refers to the pulse time width by the full width at half maximum. For example, when the peak intensity of the second prepulse laser light SP is Psp, the pulse time width Hsp of the second prepulse laser light SP is a time width of a portion having the light intensity of Psp/2 or more in the pulse time waveform of the second prepulse laser light SP. Further, when the peak intensity of the main pulse laser light M is Pm, the pulse time width Hm of the main pulse laser light M is a time width of a portion having the light intensity of Pm/2 or more in the pulse time waveform of the main pulse laser light M.

The second prepulse laser light SP is assumed to be temporally separated from the main pulse laser light M. Whether being temporally separated or not is determined by whether portions corresponding to the $1/e^2$ width are separated without temporally overlapping or are entirely or partially overlapped. The portion corresponding to the $1/e^2$ width refers to a portion having the light intensity of $1/e^2$ or more of the peak intensity in the pulse time waveform. Here, e represents the Napier number. For example, the $1/e^2$ width Wsp of the second prepulse laser light SP is a time width of a portion having the light intensity of $Psp/e^2$ or more in the pulse time waveform of the second prepulse laser light SP. Further, the $1/e^2$ width Wm of the main pulse laser light M is a time width of a portion having the light intensity of $Pm/e^2$ or more in the pulse time waveform of the main pulse laser light M. Therefore, if the portion corresponding to the $1/e^2$ width Wsp of the second prepulse laser light SP and the portion corresponding to the $1/e^2$ width Wm of the main pulse laser light M are separated from each other without being temporally overlapped, it is determined that they are temporally separated.

Figure 9:
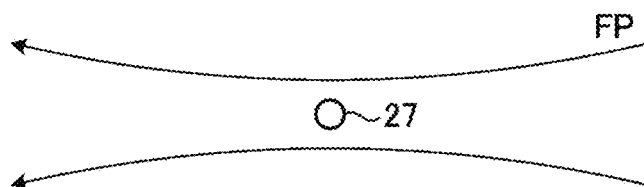
FIG. 9 conceptually shows a state in which the target is irradiated with the first prepulse laser light in the first embodiment.

FIG. 9 conceptually shows a state in which the target 27 is irradiated with the first prepulse laser light FP in the first embodiment. FIG. 9 is similar to FIG. 4 described in the comparative example.

Figure 10:
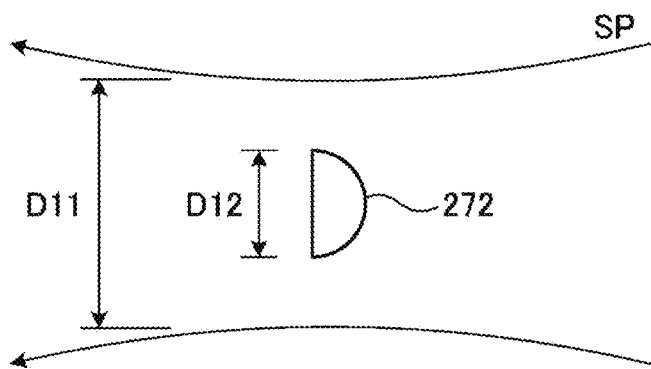
FIG. 10 conceptually shows a state in which the secondary target is irradiated with the second prepulse laser light in the first embodiment.

FIG. 10 conceptually shows a state in which the secondary target 272 is irradiated with the second prepulse laser light SP in the first embodiment. A first delay time T11 from the irradiation timing of the target 27 with the first prepulse laser light FP to the irradiation timing of the secondary target 272 with the second prepulse laser light SP is set such that CE becomes the highest. The first delay time T11 is, for example, 1.1 μs. That is, in the first embodiment, the first delay time T11 is shorter than the first delay time T01 in the comparative example. The dimension D12 of the secondary target 272 at the timing when the first delay time T11 has elapsed is less than or equal to half the dimension D11 of the beam cross section of the second prepulse laser light SP at the position of the secondary target 272.

In the first embodiment, a second delay time T12 from the irradiation timing of the secondary target 272 with the second prepulse laser light SP to the irradiation timing of the tertiary target with the main pulse laser light M is the same as the second delay time T02 in the comparative example.

3.3 CE Improvement

Figure 11:
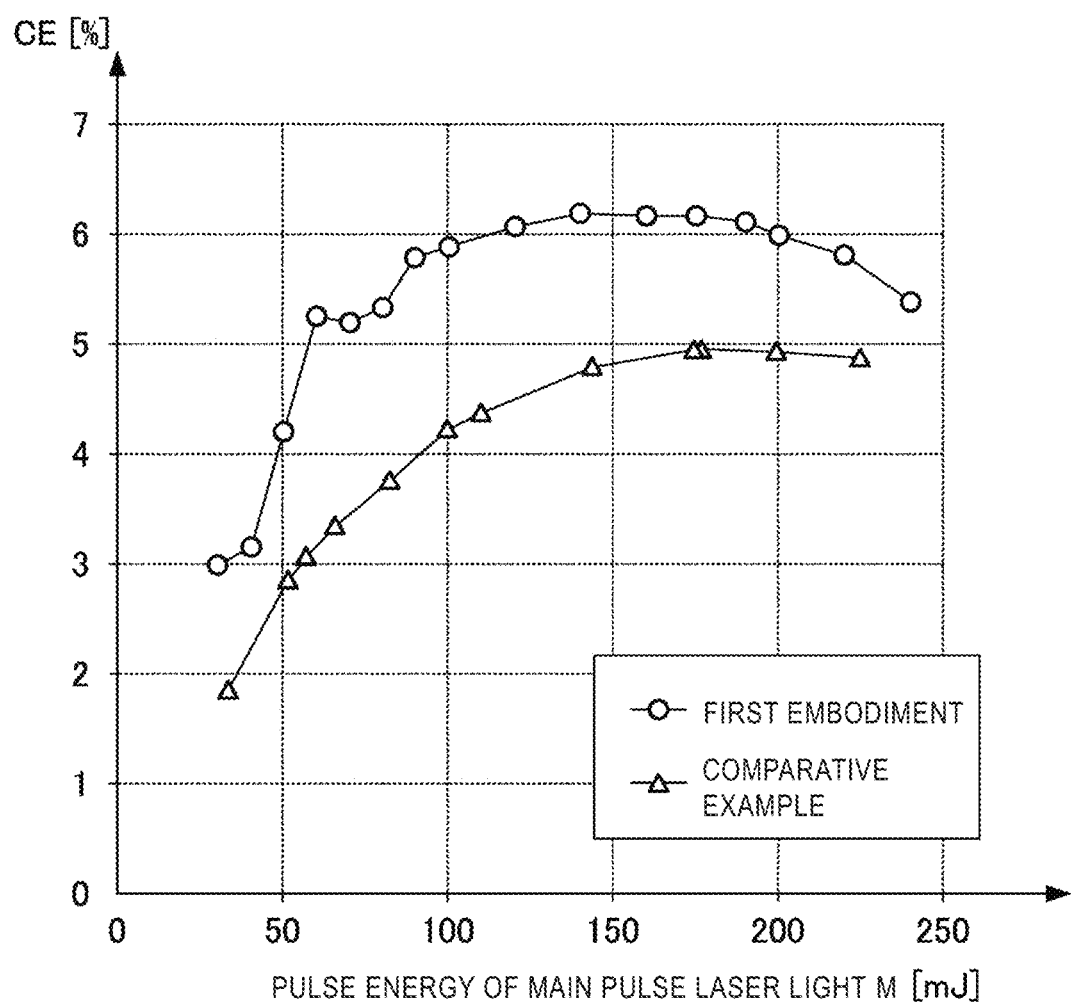
FIG. 11 is a graph showing a measurement result of CE in the first embodiment and a measurement result of CE in the comparative example.

FIG. 11 is a graph showing a measurement result of CE in the first embodiment and a measurement result of CE in the comparative example. In both the first embodiment and the comparative example, the fluence of the first prepulse laser light FP at the position of the target 27 was set to 15.1 J/cm², and the fluence of the second prepulse laser light SP at the position of the secondary target 272 was set to 2.5 J/cm². In the present disclosure, the fluence of the pulse laser light at a certain position is the value obtained by dividing the pulse energy of the pulse laser light by the area of the beam cross section of the pulse laser light at the position.

As shown in FIG. 11, the maximum value of CE was 5% or less in the comparative example, whereas the maximum value of CE was 6% or more in the first embodiment. This makes it possible to configure the EUV light generation system 11 with high power and high efficiency.

Further, in the first embodiment, it was found that high CE of 5% or more was stably obtained in a wide range in which the pulse energy of the main pulse laser light M was 60 mJ or more.

Figure 12:
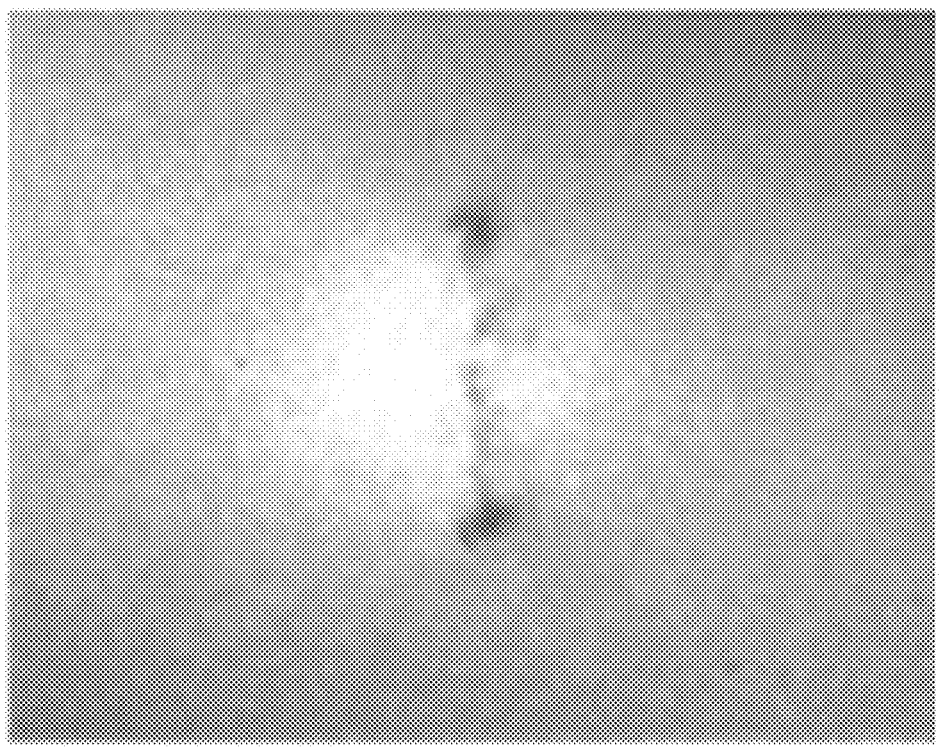
FIG. 12 is a photograph of a tertiary target at the irradiation timing with the main pulse laser light in the comparative example.
Figure 13:
FIG. 13 is a photograph of the tertiary target at the irradiation timing with the main pulse laser light in the first embodiment.

FIG. 12 is a photograph of the tertiary target at the irradiation timing with the main pulse laser light M in the comparative example, and FIG. 13 is a photograph of the tertiary target at the irradiation timing with the main pulse laser light M in the first embodiment. The irradiation timing with the main pulse laser light M refers to the timing at which the second delay time T02 or T12 has elapsed from the irradiation timing of the secondary target 272 with the second prepulse laser light SP. FIGS. 12 and 13 each show the tertiary target which is not turned into plasma as a photograph thereof at the irradiation timing with the main pulse laser light M without irradiation of the main pulse laser light M.

In each of the photographs of FIGS. 12 and 13, a black spot near the center indicates a portion where the density of the target substance is high. In the tertiary target in the comparative example, the target substance is well dispersed, but high-density portions remain more. In contrast, in the tertiary target in the first embodiment, the target substance is further well dispersed, and high-density portions remain less.

When the target substance having a density equal to or higher than the critical density is irradiated with the main pulse laser light M, the main pulse laser light M may be reflected, and thus, sufficient energy for exciting the target substance may not be provided. When the main pulse laser light M is $CO_2$ laser light, the critical density is, for example, $10^{19}$ atoms/cm$^3$. In the first embodiment, it is considered that the absorption rate of the main pulse laser light M is increased due to decrease of the portions having a density equal to or higher than the critical density along with disperse of the target substance, and CE is improved due to the target substance being efficiently turned into plasma. In other respects, the first embodiment is similar to the comparative example.

3.4 Other Configuration Examples

With reference to FIGS. 6 and 7, description is provided on the case where the pulse time width of the second prepulse laser light SP emitted from the second prepulse laser 3sp is extended to the pulse time width Hsp by the optical pulse stretcher 35, but the present disclosure is not limited thereto. The laser oscillator constituting the second prepulse laser 3sp may emit the second prepulse laser light SP having the pulse time width Hsp longer than the pulse time width Hm without providing the optical pulse stretcher 35. For example, in a flash lamp excitation pulse laser device, the second prepulse laser light SP having the pulse time width Hsp may be emitted by adjusting the waveform of the voltage applied to a flash lamp. Alternatively, in a laser diode excitation pulse laser device, the second prepulse laser light SP having the pulse time width Hsp may be emitted by adjusting the waveform of the current supplied to a laser diode. Alternatively, in a Q-switch pulse laser device, the second prepulse laser light SP having the pulse time width Hsp may be emitted by adjusting the open time of a Q-switch.

3.5 Range of Pulse Time Width Hsp of Second Prepulse Laser Light SP

Figure 14:
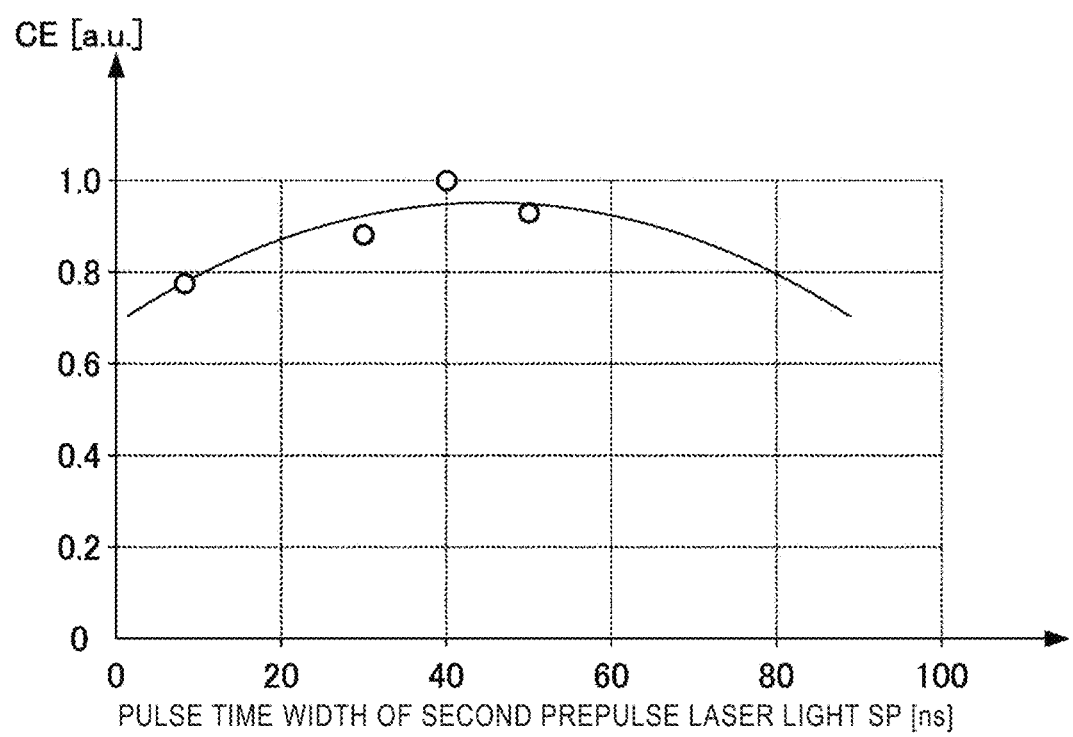
FIG. 14 is a graph showing the relationship between the pulse time width of the second prepulse laser light and CE.

FIG. 14 is a graph showing the relationship between the pulse time width Hsp of the second prepulse laser light SP and CE. The horizontal axis represents the pulse time width Hsp of the second prepulse laser light SP, and the vertical axis represents the ratio to the maximum value of CE. FIG. 14 shows a measurement result of CE by generating EUV light while changing the pulse time width Hsp of the second prepulse laser light SP under the following conditions, together with an approximate curve thereof.

The fluence of the first prepulse laser light FP at the position of the target 27 was set to 15.1 J/cm$^2$, and the pulse time width thereof was set to 14 ps. The fluence of the second prepulse laser light SP at the position of the secondary target 272 was set to 2.5 J/cm$^2$. The pulse energy of the main pulse laser light M was set to 50 mJ, and the pulse time width Hm thereof was set to 8 ns. The first delay time T11 and the second delay time T12 were set so that CE becomes the highest.

When the pulse time width Hsp of the second prepulse laser light SP was 40 ns, CE became the maximum value. From the approximate curve of FIG. 14, a preferable range of the pulse time width Hsp of the second prepulse laser light SP is defined as of 10 ns or more and 80 ns or less, and a more preferable range is defined as of 30 ns or more and 50 ns or less.

3.6 Range of Fluence of Second Prepulse Laser Light SP

Figure 15:
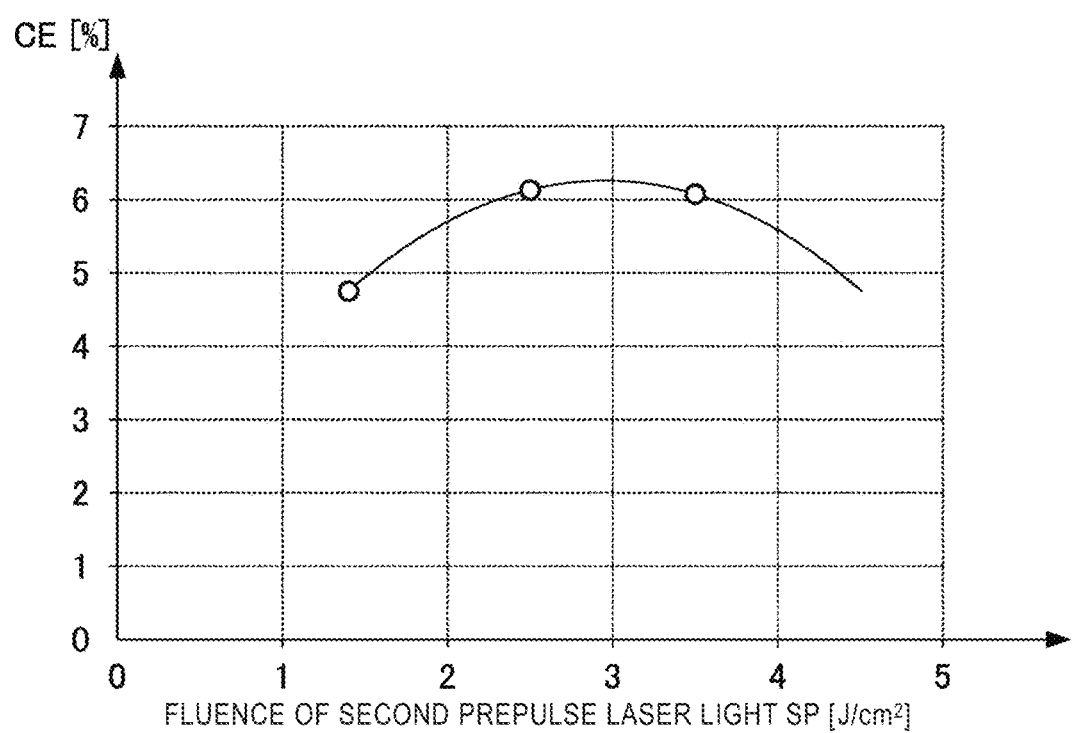
FIG. 15 is a graph showing the relationship between the fluence of the second prepulse laser light and CE.

FIG. 15 is a graph showing the relationship between the fluence of the second prepulse laser light SP and CE. The horizontal axis represents the fluence of the second prepulse laser light SP at the position of the secondary target 272 when the secondary target 272 is irradiated with the second prepulse laser light SP, and the vertical axis represents CE. FIG. 15 shows a measurement result of CE by generating EUV light while changing the fluence of the second prepulse laser light SP under the following conditions, together with an approximate curve thereof.

The fluence of the first prepulse laser light FP at the position of the target 27 was set to 15.1 J/cm$^2$, and the pulse time width thereof was set to 14 ps. The pulse time width Hsp of the second prepulse laser light SP was set to 40 ns. The pulse energy of the main pulse laser light M was set to 200 mJ, and the pulse time width Hm thereof was set to 13.5 ns. The first delay time T11 and the second delay time T12 were set so that CE becomes the highest.

CE became the highest when the fluence of the second prepulse laser light SP was 2.5 J/cm$^2$ or 3.4 J/cm$^2$. From the approximate curve of FIG. 15, a preferable range of the fluence of the second prepulse laser light SP is defined as of 1.5 J/cm$^2$ or more and 4.4 J/cm$^2$ or less, and a more preferable range is defined as of 2.5 J/cm$^2$ or more and 3.4 J/cm$^2$ or less.

3.7 Range of Fluence of First Prepulse Laser Light FP Less than 1 ns

Figure 16:
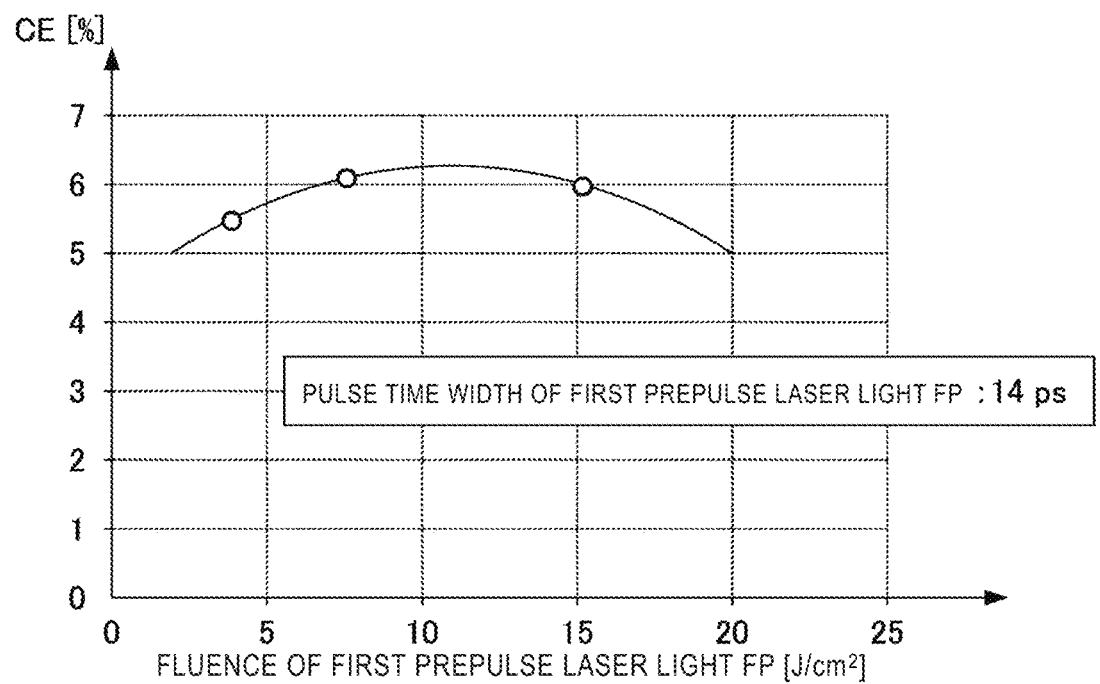
FIG. 16 is a graph showing the relationship between the fluence of the first prepulse laser light having a pulse time width less than 1 ns and CE.

FIG. 16 is a graph showing the relationship between the fluence of the first prepulse laser light FP having a pulse time width less than 1 ns and CE. The horizontal axis represents the fluence of the first prepulse laser light FP at the position of the target 27 when the target 27 is irradiated with the first prepulse laser light FP, and the vertical axis represents CE. FIG. 16 shows a measurement result of CE by generating EUV light while changing the fluence of the first prepulse laser light FP under the following conditions, together with an approximate curve thereof.

The pulse time width of the first prepulse laser light FP was set to 14 ps. The fluence of the second prepulse laser light SP at the position of the secondary target 272 was set to 2.5 J/cm$^2$, and the pulse time width Hsp thereof was set to 40 ns. The pulse energy of the main pulse laser light M was set to 200 mJ, and the pulse time width Hm thereof was set to 8 ns. The first delay time T11 and the second delay time T12 were set so that CE becomes the highest.

CE became the highest when the fluence of the first prepulse laser light FP was 7.5 J/cm² or 15.1 J/cm². From the approximate curve of FIG. 16, a preferable range of the fluence of the first prepulse laser light FP having a pulse time width less than 1 ns is defined as of 2.0 J/cm² or more and 20 J/cm² or less, and a more preferable range is defined as of 7.5 J/cm² or more and 15.1 J/cm² or less. The pulse time width of the first prepulse laser light FP is not limited to 14 ps, and may be within the range of 1 ps or more and less than 1 ns.

3.8 Range of Fluence of First Prepulse Laser Light FP of 1 ns or More

Figure 17:
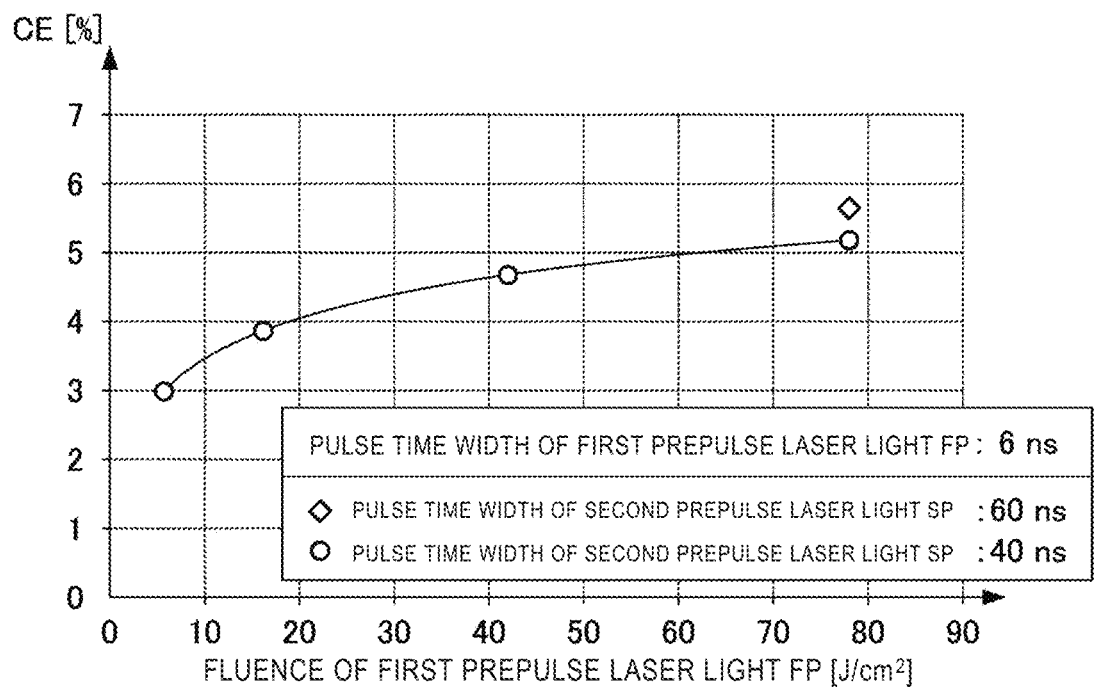
FIG. 17 is a graph showing the relationship between the fluence of the first prepulse laser light having a pulse time width of 1 ns or more and CE.

FIG. 17 is a graph showing the relationship between the fluence of the first prepulse laser light FP having a pulse time width of 1 ns or more and CE. The horizontal axis represents the fluence of the first prepulse laser light FP at the position of the target 27 when the target 27 is irradiated with the first prepulse laser light FP, and the vertical axis represents CE. FIG. 17 shows a measurement result of CE by generating EUV light while changing the fluence of the first prepulse laser light FP under the following conditions, together with an approximate curve thereof.

The pulse time width of the first prepulse laser light FP was set to 6 ns. The fluence of the second prepulse laser light SP at the position of the secondary target 272 was set to 1.2 J/cm², and the pulse time width Hsp thereof was set to 40 ns. The measurement was performed also when the fluence of the second prepulse laser light SP was set to 1.3 J/cm² and the pulse time width Hsp thereof was set to 60 ns. The pulse energy of the main pulse laser light M was set to 200 mJ, and the pulse time width Hm thereof was set to 13.5 ns. The first delay time T11 and the second delay time T12 were set so that CE becomes the highest.

A preferable range of the fluence of the first prepulse laser light FP having a pulse time width of 1 ns or more is defined as of 5.7 J/cm² or more and 200 J/cm² or less. The reason for being 5.7 J/cm² or more is that the target substance was not sufficiently dispersed with the fluence less than 5.7 J/cm². The reason for being 200 J/cm² or less is as follows. From the approximate curve of FIG. 17, it is considered that high CE can be obtained even when the fluence of the first prepulse laser light FP is 80 J/cm² or more. However, assuming that the practical upper limit of the power of the YAG laser device is 10 mJ and the spot size of the first prepulse laser light FP is 80 μm, it is considered that the upper limit of the fluence of the first prepulse laser light FP is about 200 J/cm². From the approximate curve of FIG. 17, a more preferable range of the fluence of the first prepulse laser light FP having a pulse time width of 1 ns or more is defined as 60 J/cm² or more and 78 J/cm² or less.

Figure 18:
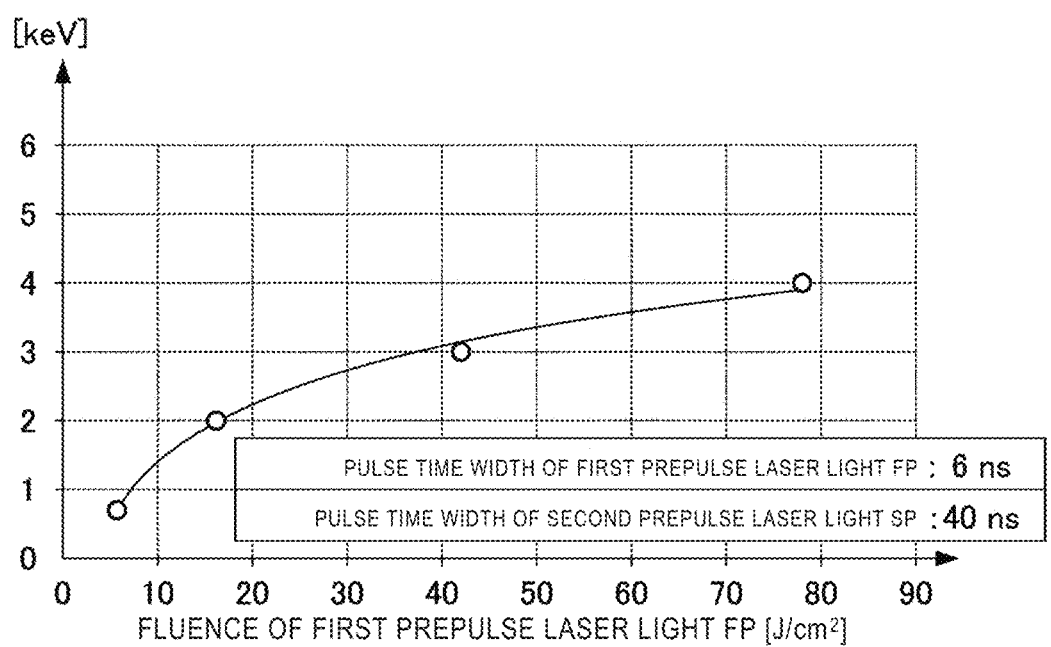
FIG. 18 is a graph showing the relationship between the fluence of the first prepulse laser light having a pulse time width of 1 ns or more and the maximum ion energy.

FIG. 18 is a graph showing the relationship between the fluence of the first prepulse laser light FP having a pulse time width of 1 ns or more and the maximum ion energy. The horizontal axis represents the fluence of the first prepulse laser light FP at the position of the target 27 when the target 27 is irradiated with the first prepulse laser light FP, and the vertical axis represents the maximum ion energy of the generated ions. The parameters of the various kinds of pulse laser light in FIG. 18 were the same as the parameters of the various kinds of pulse laser light in the case where the pulse time width Hsp of the second prepulse laser light SP was set to 40 ns in FIG. 17. Although the maximum ion energy when the pulse time width of the first prepulse laser light FP is 14 ps may be 20 keV or more, the maximum ion energy when the pulse time width of the first prepulse laser light FP was 1 ns or more was about 0.7 keV to 4.0 keV. This can reduce damage to the optical element in the chamber 2. The pulse time width of the first prepulse laser light FP is not limited to 6 ns, and may be within the range of 1 ns or more and less than 1 μs.

3.9 Range of Dimension D12 of Secondary Target 272

Figure 19:
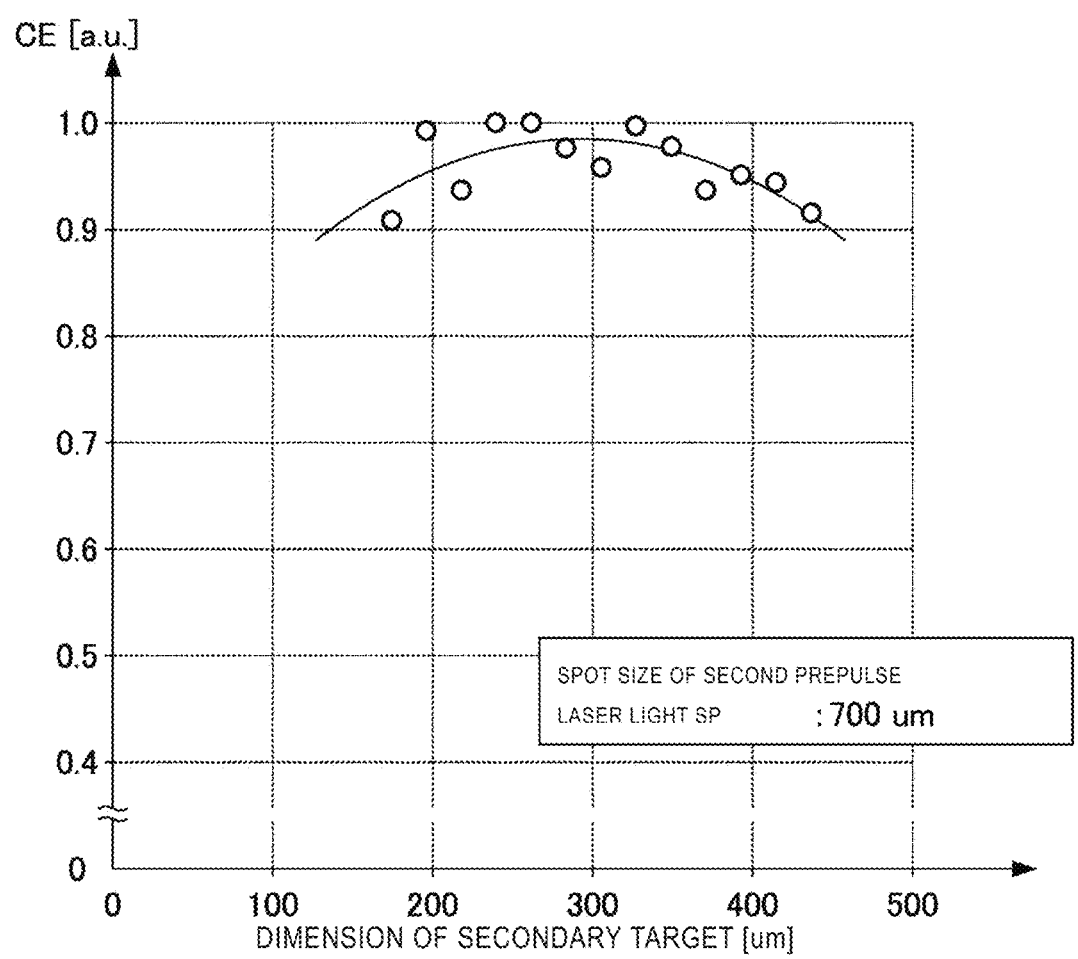
FIG. 19 is a graph showing the relationship between the dimensions of the secondary target and CE.

FIG. 19 is a graph showing the relationship between the dimension D12 of the secondary target 272 and CE. The horizontal axis represents the dimension D12 of the secondary target 272 at the timing of irradiating the secondary target 272 with the second prepulse laser light SP, and the vertical axis represents the ratio of CE to the maximum value of CE. The dimension D12 of the secondary target 272 is calculated on the basis of the first delay time T11, assuming that the diffusion speed of the target substance by the irradiation with the first prepulse laser light FP is 218 m/s. FIG. 19 shows a measurement result of CE by generating EUV light while changing the first delay time T11 under the following conditions, together with an approximate curve thereof.

The fluence of the first prepulse laser light FP at the position of the target 27 was set to 72 J/cm², and the pulse time width thereof was set to 6 ns. The fluence of the second prepulse laser light SP at the position of the secondary target 272 was set to 2.5 J/cm², the pulse time width Hsp thereof was set to 40 ns, and the spot size was 700 μm. Further, the position of the beam waist of the second prepulse laser light SP and the position of the secondary target 272 were set to substantially coincide. The pulse energy of the main pulse laser light M was set to 200 mJ, and the pulse time width Hm thereof was set to 13.5 ns. The second delay time T12 was set so that CE becomes the highest.

From the approximate curve of FIG. 19, a preferable range of the dimension D12 of the secondary target 272 is defined as of 110 μm or more and 450 μm or less, and a more preferable range is defined as of 190 μm or more and 350 μm or less. That is, the preferable range of the dimension D12 of the secondary target 272 is defined as of 15% or more and 64% or less of the dimension D11 of the beam cross section of the second prepulse laser light SP at the position of the secondary target 272, and the more preferable range is defined as of 27% or more and 50% or less thereof.

3.10 Effect

According to the first embodiment, the EUV light generation system 11 includes the laser system 3a, the chamber 2, the target supply unit 26, and the processor 5. The laser system 3a emits the first prepulse laser light FP, the second prepulse laser light SP, and the main pulse laser light M in this order. The chamber 2 is provided with at least one window 21 for introducing the first prepulse laser light FP, the second prepulse laser light SP, and the main pulse laser light M into the chamber 2. The target supply unit 26 supplies the target 27 to the plasma generation region 25 in the chamber 2. The processor 5 controls the laser system 3a so as to irradiate the target 27 with the first prepulse laser light FP, irradiate the secondary target 272 generated by irradiation with the first prepulse laser light FP with the second prepulse laser light SP having the pulse time width Hsp longer than the pulse time width Hm of the main pulse laser light M, and irradiate the tertiary target generated by irradiation with the second prepulse laser light SP with the main pulse laser light M temporally separated from the second prepulse laser light SP. By irradiating with the second prepulse laser light SP having the pulse time width Hsp longer than the pulse time width Hm of the main pulse laser light M, CE can be improved as shown in FIG. 11.

According to the first embodiment, the pulse time width Hsp of the second prepulse laser light SP is 10 ns or more and 80 ns or less, more preferably 30 ns or more and 50 ns or less. Thus, the tertiary target in which the target substance is well dispersed is generated, and CE can be improved.

According to the first embodiment, the fluence of the second prepulse laser light SP at the position of the secondary target 272 when the secondary target 272 is irradiated with the second prepulse laser light SP is 1.5 J/cm$^2$ or more and 4.4 J/cm$^2$ or less, more preferably 2.5 J/cm$^2$ or more and 3.4 J/cm$^2$ or less. Thus, the tertiary target in which the target substance is well dispersed is generated, and CE can be improved.

According to the first embodiment, when the pulse time width of the first prepulse laser light FP is less than 1 ns, the fluence of the first prepulse laser light FP at the position of the target 27 when the target 27 is irradiated with the first prepulse laser light FP is 2.0 J/cm$^2$ or more and 20 J/cm$^2$ or less. The fluence of the first prepulse laser light FP is more preferably 7.5 J/cm$^2$ or more and 15.1 J/cm$^2$ or less. By combining the irradiation with the first prepulse laser light FP satisfying this condition and the irradiation with the second prepulse laser light SP having the pulse time width Hsp longer than the pulse time width Hm of the main pulse laser light M, CE can be improved.

According to the first embodiment, when the pulse time width of the first prepulse laser light FP is 1 ns or more, the fluence of the first prepulse laser light FP at the position of the target 27 when the target 27 is irradiated with the first prepulse laser light FP is 60 J/cm$^2$ or more and 78 J/cm$^2$ or less. By combining the irradiation with the first prepulse laser light FP satisfying this condition and the irradiation with the second prepulse laser light SP having the pulse time width Hsp longer than the pulse time width Hm of the main pulse laser light M, CE can be improved. In addition, the ion energy can be suppressed and damage to the optical element in the chamber 2 can be reduced.

According to the first embodiment, the dimension D12 of the secondary target 272 at the timing of irradiating the secondary target 272 with the second prepulse laser light SP is 15% or more and 64% or less, more preferably 27% or more and 50% or less of the dimension D11 of the beam cross section of the second prepulse laser light SP at the position of the secondary target 272. In addition to the pulse time width Hsp of the second prepulse laser light SP, by setting the dimension D11 of the beam cross section in this manner, the tertiary target in which the target substance is well dispersed can be generated in the plasma generation region 25, and CE can be improved.

According to the first embodiment, the laser system 3a includes the first prepulse laser 3fp that emits the first prepulse laser light FP, the second prepulse laser 3sp that emits the second prepulse laser light SP, the optical pulse stretcher 35 that is arranged on the optical path of the second prepulse laser light SP, and the main pulse laser 3m that emits the main pulse laser light M. Thus, the pulse time width Hsp of the second prepulse laser light SP can be extended with a simple configuration.

Figure 20:
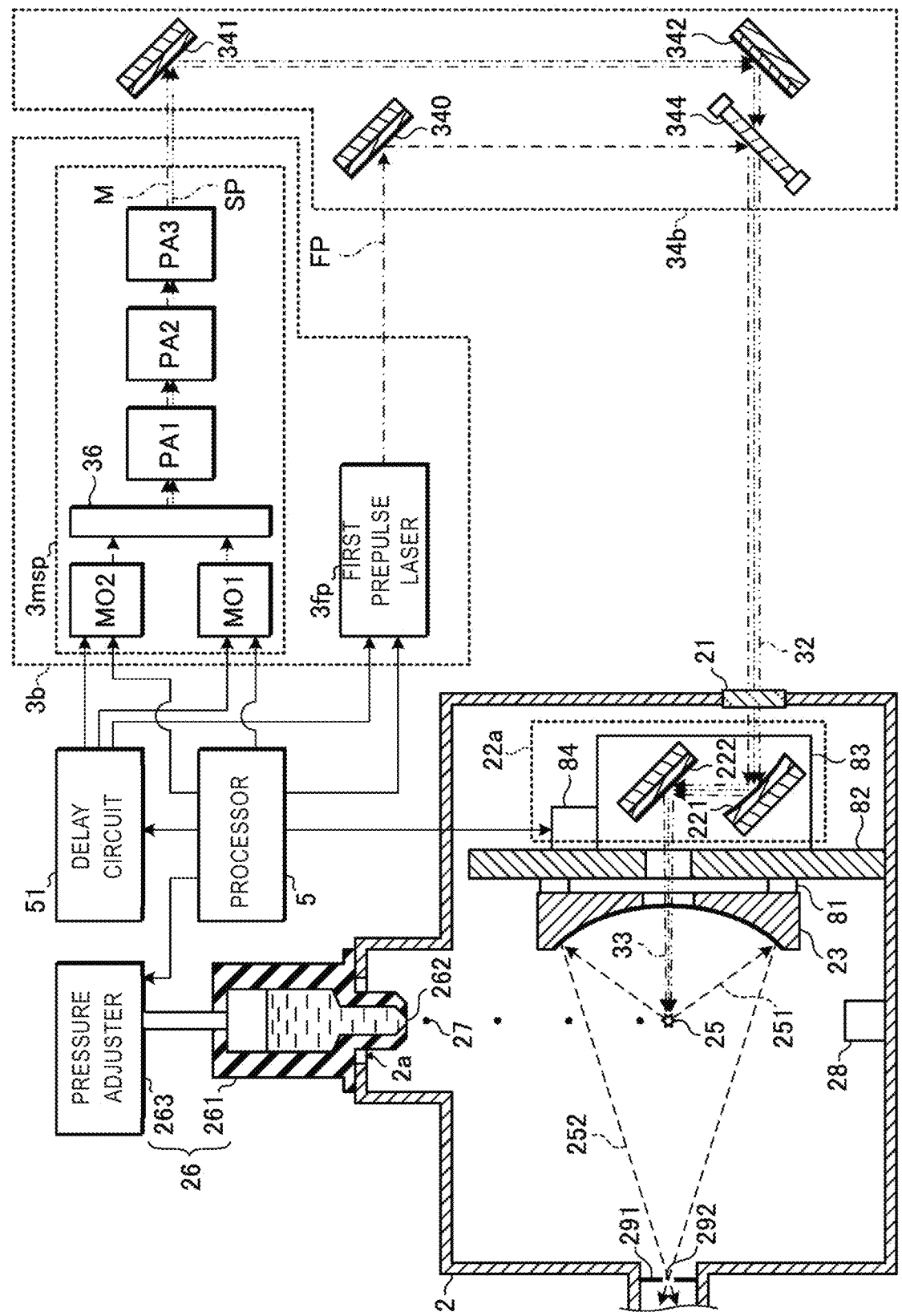
FIG. 20 is a partial sectional view showing the configuration of the EUV light generation system according to a second embodiment.

4. CO$_2$ Laser Device for Emitting Second Prepulse Laser Light SP 4.1 Configuration FIG. 20 is a partial sectional view showing the configuration of the EUV light generation system 11 according to a second embodiment.

In the second embodiment, a laser system 3b includes the first prepulse laser 3fp and a main pulse laser 3msp. The main pulse laser 3msp includes first and second master oscillators MO1 and MO2, a beam combiner 36, and a plurality of CO$_2$ gas laser amplifiers PA1, PA2, and PA3. The first and second master oscillators MO1 and MO2 are arranged in parallel so as to emit first seed light and second seed light, respectively, to enter the beam combiner 36. The CO$_2$ gas laser amplifiers PA1, PA2, and PA3 are arranged in series so that the first seed light and the second seed light output from the beam combiner 36 pass therethrough. The CO$_2$ gas laser amplifiers PA1, PA2, and PA3 have a plurality of amplification wavelengths respectively in the wavelength region around 10.6 μm. The first prepulse laser 3fp corresponds to the first laser device in the present disclosure, and the main pulse laser 3msp corresponds to the second laser device in the present disclosure.

The laser light transmission device 34b includes the high reflection mirrors 340, 341, and 342, and the beam combiner 344.

4.2 Operation

The first master oscillator MO1 performs laser oscillation at a first amplification wavelength among the plurality of amplification wavelengths of the CO$_2$ gas laser amplifiers PA1, PA2, and PA3 and emits the first seed light. The second master oscillator MO2 performs laser oscillation at a second amplification wavelength among the plurality of amplification wavelengths of the CO$_2$ gas laser amplifiers PA1, PA2, and PA3 and emits the second seed light. After the first prepulse laser 3fp oscillates, the first master oscillator MO1 oscillates, and then, the second master oscillator MO2 oscillates. The second seed light emitted from the second master oscillator MO2 has a shorter pulse time width and higher pulse energy than the first seed light emitted from the first master oscillator MO1.

The beam combiner 36 causes the first seed light and the second seed light emitted from the first and second master oscillators MO1 and MO2, respectively, to enter the CO$_2$ gas laser amplifier PA1.

The first seed light is sequentially amplified by the CO$_2$ gas laser amplifiers PA1, PA2, and PA3 to become the second prepulse laser light SP. In the CO$_2$ gas laser amplifiers PA1, PA2, and PA3, although the laser gain of the first amplification wavelength is reduced by amplifying the first seed light, reduction of the laser gain of the second amplification wavelength is suppressed. The second seed light is sequentially amplified by the CO$_2$ gas laser amplifiers PA1, PA2, and PA3 to become the main pulse laser light M having a shorter pulse time width and higher pulse energy than the second prepulse laser light SP. In the CO$_2$ gas laser amplifiers PA1, PA2, and PA3, the laser gain of the second amplification wavelength is reduced by amplifying the second seed light. The laser gains of the first and second amplification wavelengths are recovered until the next pulse enters.

The first prepulse laser light FP emitted from the first prepulse laser 3fp is reflected by the high reflection mirror 340 and the beam combiner 344 and enters the chamber 2. The second prepulse laser light SP and the main pulse laser light M emitted from the main pulse laser 3msp are reflected by the high reflection mirrors 341 and 342, pass through the beam combiner 344, and enter the chamber 2.

4.3 Details of First Master Oscillator MO1

4.3.1 First Configuration Example

Figure 21:
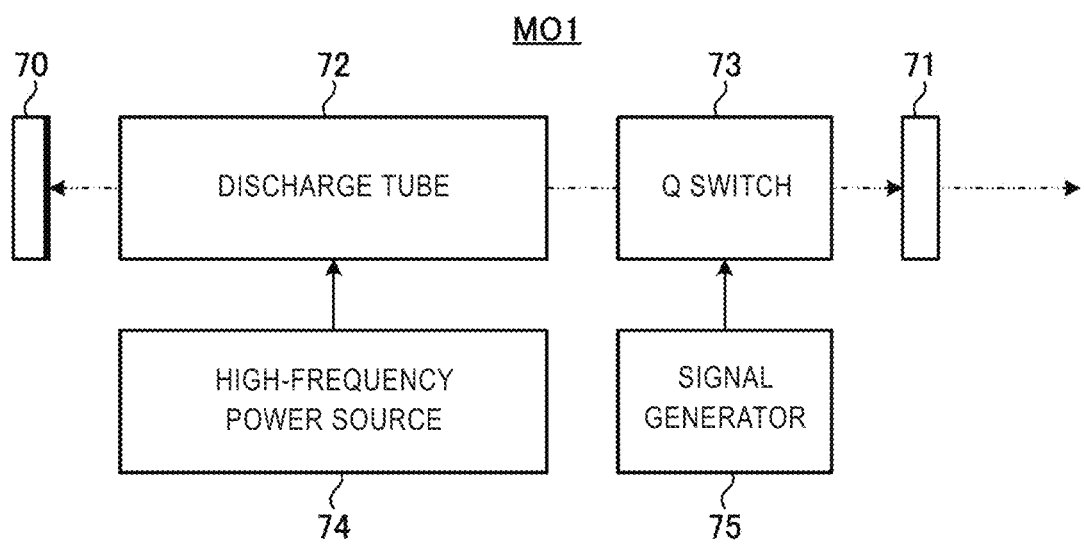
FIG. 21 schematically shows a first configuration example of a first master oscillator of the second embodiment FIG. 22 schematically shows a second configuration example of the first master oscillator of the second embodiment.

FIG. 21 schematically shows a first configuration example of the first master oscillator MO1 in the second embodiment. The first master oscillator MO1 according to the first configuration example is constituted by a CO$_2$ laser oscillator. The first master oscillator MO1 includes a rear mirror 70, a front mirror 71, a discharge tube 72, and a Q switch 73. The rear mirror 70 is a high reflection mirror, the front mirror 71 is a partial reflection mirror, and the rear mirror 70 and the front mirror 71 constitute an optical resonator. The discharge tube 72 is arranged in the optical path of the optical resonator, and accommodates a laser amplification medium containing $CO_2$ gas and a discharge electrode. A high-frequency power source 74 is connected to the discharge electrode. The Q switch 73 includes, for example, an acoustic optical element and is configured to be switched between a closed state and an open state in accordance with a signal received from a signal generator 75.

When a voltage is supplied from the high-frequency power source 74 to the discharge electrode included in the discharge tube 72, the laser amplification medium in the discharge tube 72 is excited, and light is emitted from the discharge tube 72. Although laser oscillation does not occur when the Q switch 73 is in the closed state, laser oscillation occurs and pulse laser light is output from the front mirror 71 toward the beam combiner 36 as the first seed light when the Q switch 73 is in the open state. The pulse time width of the pulse laser light is controlled to, for example, 40 ns by the waveform of the signal supplied from the signal generator 75 to the Q switch 73.

4.3.2 Second Configuration Example

Figure 22:
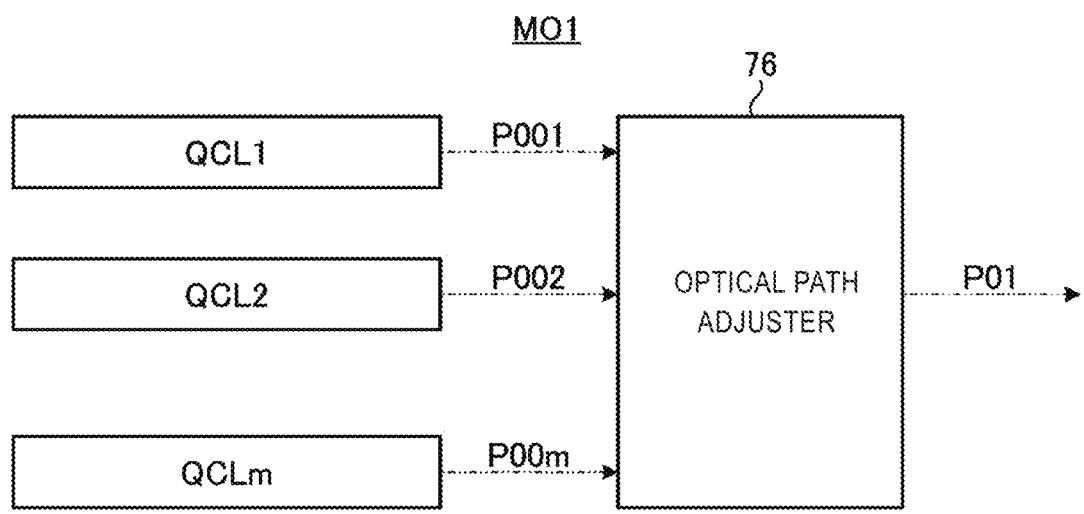

FIG. 22 schematically shows a second configuration example of the first master oscillator MO1 in the second embodiment. The first master oscillator MO1 according to the second configuration example includes a plurality of quantum cascade lasers QCL1 to QCLm and an optical path adjuster 76. Each of the quantum cascade lasers QCL1 to QCLm is a semiconductor laser having a configuration in which quantum wells are connected in multiple stages. The optical path adjuster 76 is arranged in the optical paths of pulse laser light P001 to P00m emitted from the quantum cascade lasers QCL1 to QCLm.

The quantum cascade lasers QCL1 to QCLm emit the pulse laser light P001 to P00m having different wavelengths. However, each of these wavelengths is adjusted to substantially coincide with any of the amplification wavelengths of the $CO_2$ gas laser amplifiers PA1, PA2 and PA3. Each of the pulse laser light P001 to P00m is emitted at different emission timing.

The optical path adjuster 76 merges the optical paths of the pulse laser light P001 to P00m into one optical path, and outputs merged pulse laser light P01 toward the beam combiner 36 as the first seed light. When the difference in the emission timing between the pulse laser light P001 emitted first and the pulse laser light P00m emitted last among the pulse laser light P001 to P00m is 40 ns, the pulse time width of the pulse laser light P01 is about 40 ns.

4.4 Effect

According to the second embodiment, the laser system 3b includes the first prepulse laser 3fp that emits the first prepulse laser light FP and the main pulse laser 3msp that emits the second prepulse laser light SP and the main pulse laser light M. The main pulse laser 3msp includes the $CO_2$ gas laser amplifiers PA1, PA2, and PA3, the first master oscillator MO1, the second master oscillator MO2, and the beam combiner 36. The first master oscillator MO1 emits the first seed light having the first amplification wavelength among the plurality of amplification wavelengths of the $CO_2$ gas laser amplifiers PA1, PA2, and PA3. After the first seed light is emitted, the second master oscillator MO2 emits the second seed light having the second amplification wavelength among the plurality of amplification wavelengths and having the pulse time width shorter than that of the first seed light. The beam combiner 36 causes the first seed light and the second seed light to enter the $CO_2$ gas laser amplifiers PA1, PA2, and PA3. Accordingly, since the main pulse laser 3msp emits the second prepulse laser light SP and the main pulse laser light M, it is not necessary to provide the second prepulse laser asp (see FIG. 6). Further, the beam combiner 343 is not necessary as well. In other respects, the second embodiment is similar to the first embodiment.

5. Others

Figure 23:
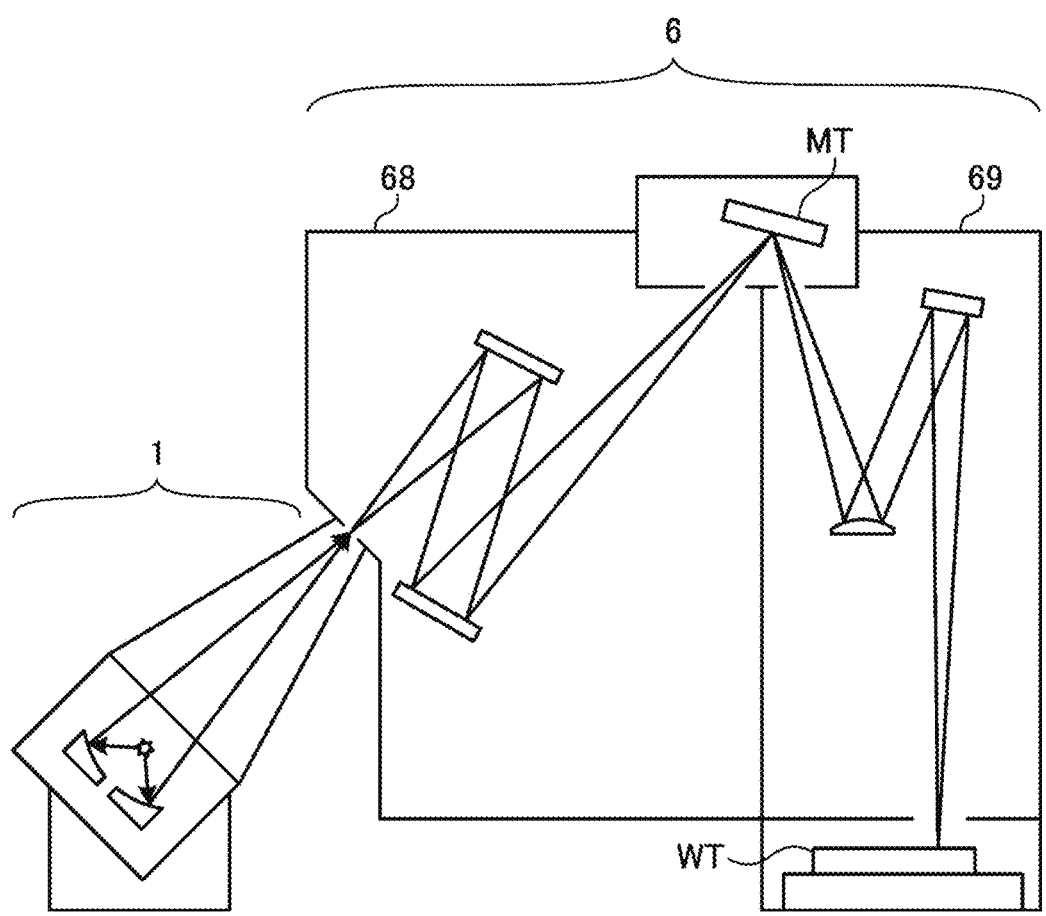
FIG. 23 schematically shows a configuration of an exposure apparatus connected to the EUV light generation apparatus.

FIG. 23 schematically shows a configuration of the exposure apparatus 6 connected to the EUV light generation apparatus 1. In FIG. 23, the exposure apparatus 6 includes a mask irradiation unit 68 and a workpiece irradiation unit 69. The mask irradiation unit 68 illuminates, via a reflection optical system, a mask pattern of the mask table MT with the EUV light incident from the EUV light generation apparatus 1. The workpiece irradiation unit 69 images the EUV light reflected by the mask table MT onto a workpiece (not shown) arranged on the workpiece table WT via the reflection optical system. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation system, comprising:
 a laser system configured to emit first prepulse laser light, second prepulse laser light, and main pulse laser light in this order;
 a chamber including at least one window for introducing, into the chamber, the first prepulse laser light, the second prepulse laser light, and the main pulse laser light;
 a target supply unit configured to supply a target to a predetermined region in the chamber; and
 a processor configured to control the laser system so as to irradiate the target with the first prepulse laser light, irradiate the target, having been irradiated with the first prepulse laser light, with the second prepulse laser light having a pulse time width longer than a pulse time width of the main pulse laser light, and irradiate the target, having been irradiated with the second prepulse laser light, with the main pulse laser light temporally separated from the second prepulse laser light.

2. The extreme ultraviolet light generation system according to claim 1,
wherein the pulse time width of the second prepulse laser light is within a range of 10 ns to 80 ns.

3. The extreme ultraviolet light generation system according to claim 1,
wherein the pulse time width of the second prepulse laser light is within a range of 30 ns to 50 ns.

4. The extreme ultraviolet light generation system according to claim 1,
wherein fluence of the second prepulse laser light at a position of the target when the target is irradiated with the second prepulse laser light is within a range of 1.5 $J/cm^2$ to 4.4 $J/cm^2$.

5. The extreme ultraviolet light generation system according to claim 1,
wherein fluence of the second prepulse laser light at a position of the target when the target is irradiated with the second prepulse laser light is within a range of 2.5 $J/cm^2$ to 3.4 $J/cm^2$.

6. The extreme ultraviolet light generation system according to claim 1,
wherein the pulse time width of the first prepulse laser light is less than 1 ns, and fluence of the first prepulse laser light at a position of the target when the target is irradiated with the first prepulse laser light is within a range of 2.0 $J/cm^2$ to 20 $J/cm^2$.

7. The extreme ultraviolet light generation system according to claim 1,
wherein the pulse time width of the first prepulse laser light is less than 1 ns, and fluence of the first prepulse laser light at a position of the target when the target is irradiated with the first prepulse laser light is within a range of 7.5 $J/cm^2$ to 15.1 $J/cm^2$.

8. The extreme ultraviolet light generation system according to claim 1,
wherein the pulse time width of the first prepulse laser light is 1 ns or more, and fluence of the first prepulse laser light at a position of the target when the target is irradiated with the first prepulse laser light is within a range of 60 $J/cm^2$ to 78 $J/cm^2$.

9. The extreme ultraviolet light generation system according to claim 1,
wherein a dimension of the target at timing of irradiating the target with the second prepulse laser light is within a range of 15% to 64% of a dimension of a beam cross section of the second prepulse laser light at a position of the target.

10. The extreme ultraviolet light generation system according to claim 1,
wherein a dimension of the target at timing of irradiating the target with the second prepulse laser light is within a range of 27% to 50% of a dimension of a beam cross section of the second prepulse laser light at a position of the target.

11. The extreme ultraviolet light generation system according to claim 1,
wherein the laser system includes a first prepulse laser configured to emit the first prepulse laser light, a second prepulse laser configured to emit the second prepulse laser light, an optical pulse stretcher arranged on an optical path of the second prepulse laser light, and a main pulse laser configured to emit the main pulse laser light.

12. The extreme ultraviolet light generation system according to claim 1,
wherein the laser system includes a first laser device configured to emit the first prepulse laser light, and a second laser device configured to emit the second prepulse laser light and the main pulse laser light, and
the second laser device includes $CO_2$ gas laser amplifiers, a first master oscillator configured to emit first seed light having a first amplification wavelength among a plurality of amplification wavelengths of the $CO_2$ gas laser amplifiers, a second master oscillator configured to emit second seed light having a second amplification wavelength among the plurality of amplification wavelengths and having a pulse time width shorter than that of the first seed light, and a beam combiner configured to cause the first seed light and the second seed light to enter the $CO_2$ gas laser amplifier.

13. An electronic device manufacturing method, comprising:
generating extreme ultraviolet light using an extreme ultraviolet light generation system;
emitting the extreme ultraviolet light to an exposure apparatus; and
exposing a photosensitive substrate to the extreme ultraviolet light in the exposure apparatus to manufacture an electronic device,
the extreme ultraviolet light generation system including a laser system configured to emit first prepulse laser light, second prepulse laser light, and main pulse laser light in this order; a chamber including at least one window for introducing, into the chamber, the first prepulse laser light, the second prepulse laser light, and the main pulse laser light; a target supply unit configured to supply a target to a predetermined region in the chamber; and a processor configured to control the laser system so as to irradiate the target with the first prepulse laser light, irradiate the target, having been irradiated with the first prepulse laser light, with the second prepulse laser light having a pulse time width longer than a pulse time width of the main pulse laser light, and irradiate the target, having been irradiated with the second prepulse laser light, with the main pulse laser light temporally separated from the second prepulse laser light.

14. The electronic device manufacturing method according to claim 13,
wherein the pulse time width of the second prepulse laser light is within a range of 10 ns to 80 ns.

15. The electronic device manufacturing method according to claim 13,
wherein fluence of the second prepulse laser light at a position of the target when the target is irradiated with the second prepulse laser light is within a range of 1.5 $J/cm^2$ to 4.4 $J/cm^2$.

16. The electronic device manufacturing method according to claim 13,
wherein the pulse time width of the first prepulse laser light is less than 1 ns, and fluence of the first prepulse laser light at a position of the target when the target is irradiated with the first prepulse laser light is within a range of 2.0 $J/cm^2$ to 20 $J/cm^2$.

17. The electronic device manufacturing method according to claim 13,
wherein the pulse time width of the first prepulse laser light is 1 ns or more, and fluence of the first prepulse laser light at a position of the target when the target is irradiated with the first prepulse laser light is within a range of 60 $J/cm^2$ to 78 $J/cm^2$.

18. The electronic device manufacturing method according to claim 13,
wherein a dimension of the target at timing of irradiating the target with the second prepulse laser light is within a range of 15% to 64% of a dimension of a beam cross section of the second prepulse laser light at a position of the target.

19. The electronic device manufacturing method according to claim 13,
wherein the laser system includes a first prepulse laser configured to emit the first prepulse laser light, a second prepulse laser configured to emit the second prepulse laser light, an optical pulse stretcher arranged on an optical path of the second prepulse laser light, and a main pulse laser configured to emit the main pulse laser light.

20. The electronic device manufacturing method according to claim 13,
wherein the laser system includes a first laser device configured to emit the first prepulse laser light, and a second laser device configured to emit the second prepulse laser light and the main pulse laser light, and
the second laser device includes $CO_2$ gas laser amplifiers, a first master oscillator configured to emit first seed light having a first amplification wavelength among a plurality of amplification wavelengths of the $CO_2$ gas laser amplifiers, a second master oscillator configured to emit second seed light having a second amplification wavelength among the plurality of amplification wavelengths and having a pulse time width shorter than that of the first seed light, and a beam combiner configured to cause the first seed light and the second seed light to enter the $CO_2$ gas laser amplifier.

* * * * *